US 6,731,397 B1

(12) United States Patent
Merrill et al.

(10) Patent No.: US 6,731,397 B1
(45) Date of Patent: May 4, 2004

(54) METHOD FOR STORING AND RETRIEVING DIGITAL IMAGE DATA FROM AN IMAGING ARRAY

(75) Inventors: Richard B. Merrill, Santa Clara, CA (US); Richard F. Lyon, Santa Clara, CA (US); Carver A. Mead, Santa Clara, CA (US)

(73) Assignee: Foveon, Inc., Santa Clara, CA (US)

( * ) Notice: Subject to any disclaimer, the term of this patent is extended or adjusted under 35 U.S.C. 154(b) by 0 days.

(21) Appl. No.: 09/316,731

(22) Filed: May 21, 1999

(51) Int. Cl.[7] ............................ G06K 1/00; H01L 31/00; H01L 27/00; G01J 3/50
(52) U.S. Cl. .................. 358/1.16; 257/440; 250/208.1; 250/226
(58) Field of Search ................. 358/1.16; 257/440; 250/226, 208.1

(56) References Cited

U.S. PATENT DOCUMENTS

| | | | |
|---|---|---|---|
| 3,971,065 A | 7/1976 | Bayer | 358/41 |
| 4,011,016 A | 3/1977 | Layne et al. | 356/195 |
| 4,309,604 A | 1/1982 | Yoshikawa et al. | 250/226 |
| 4,613,895 A | 9/1986 | Burkey et al. | 358/41 |
| 4,651,001 A | 3/1987 | Harada et al. | 250/330 |
| 4,677,289 A | 6/1987 | Nozaki et al. | 250/226 |
| 4,845,553 A | 7/1989 | Konomura et al. | 358/98 |
| 5,397,734 A | 3/1995 | Iguchi et al. | 437/70 |
| 5,414,465 A | 5/1995 | Kodama et al. | 348/236 |
| 5,502,299 A | 3/1996 | Standley | 250/208.2 |
| 5,557,688 A * | 9/1996 | Nakamura | 382/164 |
| 5,600,373 A * | 2/1997 | Chui et al. | 375/240.1 |
| 5,668,596 A | 9/1997 | Vogel | 348/222 |
| 5,739,562 A | 4/1998 | Ackland et al. | 257/291 |
| 5,965,875 A * | 10/1999 | Merrill | 250/226 |
| 6,097,471 A * | 8/2000 | Buhr et al. | 355/38 |
| 6,281,561 B1 * | 8/2001 | Stiebig et al. | 257/440 |
| 6,304,895 B1 * | 10/2001 | Schneider | 709/203 |

FOREIGN PATENT DOCUMENTS

| | | | |
|---|---|---|---|
| JP | 04278930 | 10/1990 | H04N/9/09 |
| JP | 06133320 | 5/1994 | H04N/9/09 |
| JP | 06141488 | 6/1994 | H04N/9/04 |
| JP | 08009391 | 12/1996 | H04N/9/04 |

OTHER PUBLICATIONS

Don Sutherland, "The Latest in Digital SLRs", Neaveau Niche, Shutterbug, Nov. 1997, pp. 194–195, 202, 208, 210.

Bob Weibel, "High–end digital cameras can make professional indoor photography a snap", Buyer's Guide, Studio Audience, Published Apr. 1997, pp. 71–78.

Ken Parulski, et al., "Enabling technologies for a family of digital cameras", Invited Paper, SPIE vol. 2654, pp. 156–163.

Hon–Sum Wong, "Technology and Device Scaling Considerations for CMOS Imagers", Senior Member, IEEE, Transactions on Electron Devices, vol. 43, No. 12, Dec. 1996, pp. 2131–2142.

(List continued on next page.)

Primary Examiner—Edward Coles
Assistant Examiner—Houshang Safaipour
(74) Attorney, Agent, or Firm—Sierra Patent Group, Ltd.

(57) ABSTRACT

A method for storing digital information from an image sensor comprises the steps of providing an image sensor producing three-color output data at each of a plurality of pixel locations; providing a digital storage device coupled to the image sensor; sensing three-color digital output data from the image sensor; and storing said three-color output data as digital data in the digital storage device without performing any interpolation on the three-color output data. The data may be compressed prior to storage and expanded after retrieval from storage. In a preferred embodiment, the image sensor comprises a triple-junction active pixel sensor array.

28 Claims, 16 Drawing Sheets

OTHER PUBLICATIONS

Albert J.P. Theuwissen, "Solid–State Imaging with Charge–Coupled Devices", Kluwer Academic Publishers, pp. 131–141.

Savvas G. Chamberlain, "Photosensitivity and Scanning of Silicon Image Detector Arrays", IEEE Journal of Solid–State Circuits, vol. SC–4, No. 6, Dec. 1969, pp, 333–342.

D. Knipp, et al. "Low Cost Approach to Realize Novel Detectors for Color Recognition", pp. 350–353.

Mohamed Ben Chouikha et al. Color sensitive photodetectors in standard CMOS and BiCMOS technologies, SPIE vol. 2950, 8/96, pp. 108–120.

\* cited by examiner

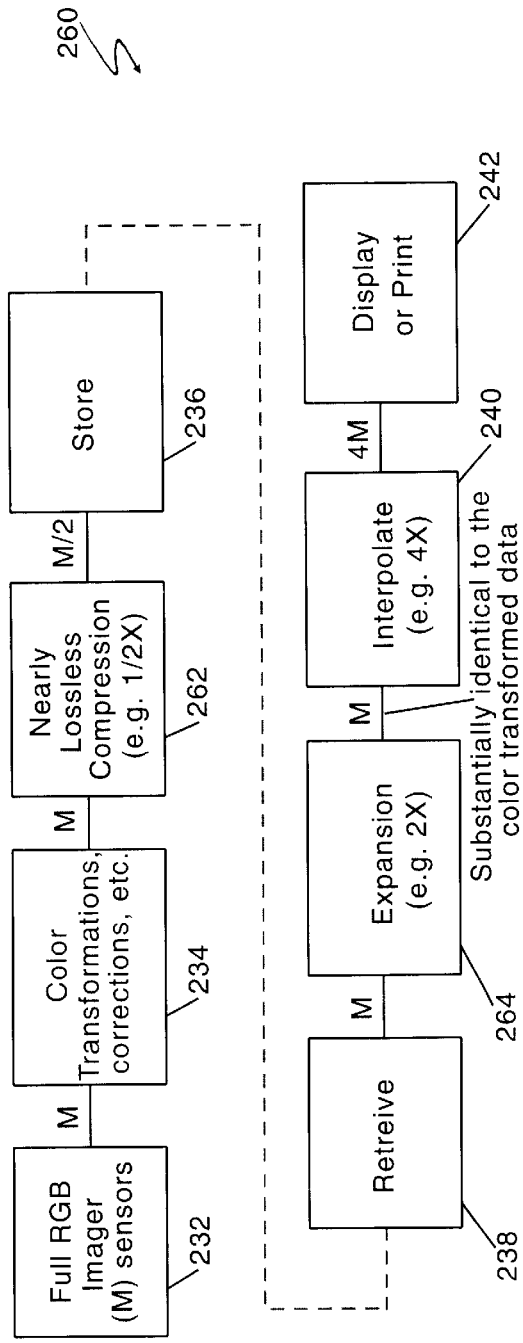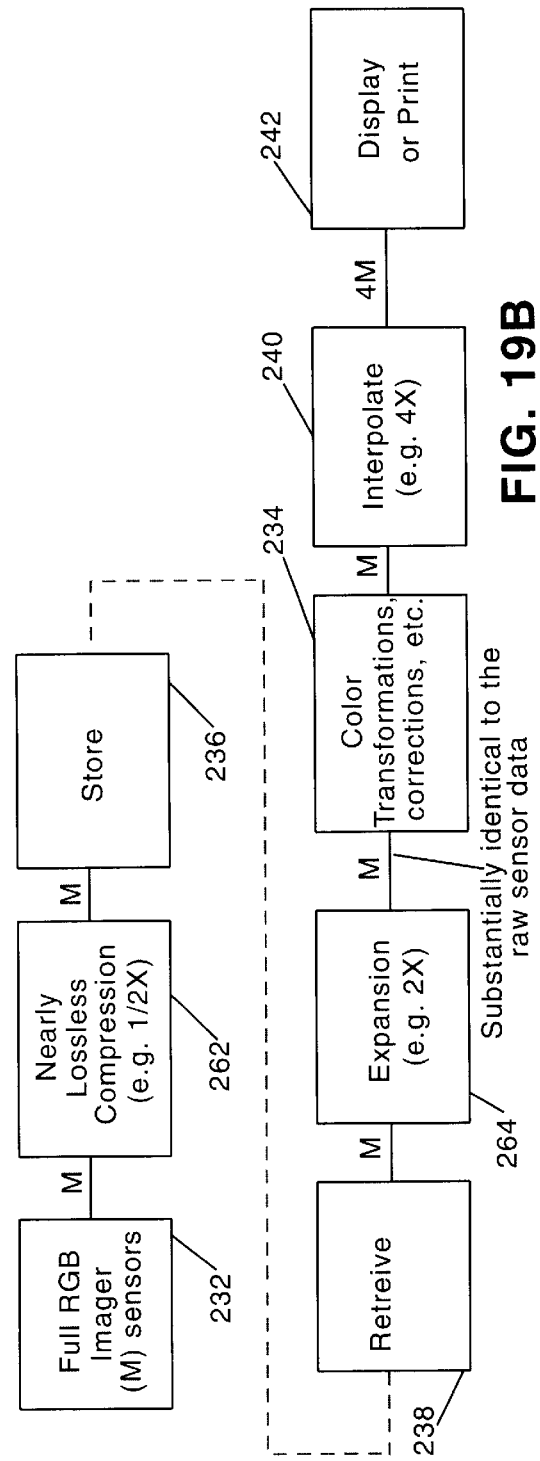

METHOD FOR STORING AND RETRIEVING DIGITAL IMAGE DATA FROM AN IMAGING ARRAY

BACKGROUND OF THE INVENTION

1. Field of the Invention

The present invention relates to the capture, storage, and retrieval of digital images. More particularly, the present invention relates to novel methods for storing and retrieving pixel data from a full-color RGB imaging array imbedded in a device such as a digital camera.

Furthermore, the present invention also relates to active pixel sensors and active pixel sensor arrays. More particularly, the present invention relates to arrays of active pixel sensors wherein each of the active pixel sensors is a triple-junction structure to ensure that each pixel sensor in the array measures each of the three primary colors (R-G-B) in the same location.

Finally, the present invention relates to a device such as a digital camera that employs both a triple-junction active pixel sensor array and a novel method of capturing, storing, and retrieving the data provided by the array.

2. The Prior Art

The process of capturing, processing, storing, and retrieving digital data is common in the field of digital imaging.

Generally, a digital image is provided from a source, such as a camera. Many types of cameras are prevalent in the field of digital imaging, including digital, video, and television cameras. Whatever the type of camera used, it is often desired that the image be captured and stored in a digital format, so that the image may later be edited or otherwise processed. In the prior art, it is common to interpolate and compress the digital image data prior to storage. Manipulating the data before storing it posses certain disadvantages that are inherent in the procedures utilized heretofore in the prior art.

First, the process of interpolation may introduce irreversible changes in the digital image data. Interpolation is the process of correcting the data for errors that occur by virtue of the type of camera or sensor that is utilized within the camera. Therefore, the type of interpolation that is used, or the need for interpolation at all, is determined by the nature of the imaging process utilized. For example, it is common in the art to utilize digital sensors that contain charge-coupled devices (CCD) or metal oxide semiconductor (MOS) transistors. Within the sensor, the smallest resolvable full-color image component ("pixel") is usually comprised of four separate sensors: two green, one blue, and one red. These sensors are used to produce three-color digital output. However, Interpolation is necessary to correct for distortions caused by the small, though finite distances, that separate the four individual sensors that make up each pixel. The result of this interpolation is often a great increase in the size of the original digital image; often this increase in data size is three-fold. Along with this increase in size, interpolation can compromise the integrity of the original data if performed prior to storage.

Second, after the step of interpolation, the digital image data is often compressed prior to storage. Compression is necessary often because of the increase in size after the interpolation function just discussed, as well as to facilitate transmission through systems of limited bandwidth, such as television systems. However, in compression methods commonly used, once a digital image has been compressed, it can never be restored to its original state. This is a major disadvantage if access to the original, uncompressed digital image data is ever desired.

The problems with the interpolation and compression of digital image data prior to storage manifest themselves as poor-quality output when viewed on a screen or printed. In fact, interpolation or compression techniques often create moiré patterns on fine-pitched fabrics, or result in the loss of detail and/or distortions along the edges or between fine lines in the subject matter.

In light of the above background, it is apparent that there is a need for a digital imaging storage and retrieval method that eliminates the problems associated with the interpolation and compression of digital image data.

Furthermore, in light of the above background, it would be advantageous for a digital imaging storage and retrieval system to be coupled with an active pixel sensor array.

BRIEF DESCRIPTION OF THE INVENTION

A method according to the present invention for storing digital information from an image sensor array comprising the steps of: providing an image sensor array producing three-color output data at each of a plurality of pixel locations; providing a digital storage device coupled to the image sensor array; sensing three-color output data from the image sensor array; and storing the three-color digital output data as digital data in the digital storage device without performing any interpolation on the three-color output data. The storage step may be performed using a semiconductor memory device such as a random access memory or the like.

Another method according to the present invention utilizes the above method on an image obtained from an image sensor array further comprising a triple-junction structure where each pixel in the array measures each of the primary colors at the same location.

The method of the present invention may also optionally include the step of performing a lossless compression operation on the three-color digital output data prior to the step of storing the three-color digital output data in the digital storage device.

BRIEF DESCRIPTION OF THE DRAWING FIGURES

FIGS. 11, 12, 13, 14, and 15 are schematic diagrams of active pixel sensors having multiple storage nodes according to first through fifth embodiments of the present invention.

Figure 15:
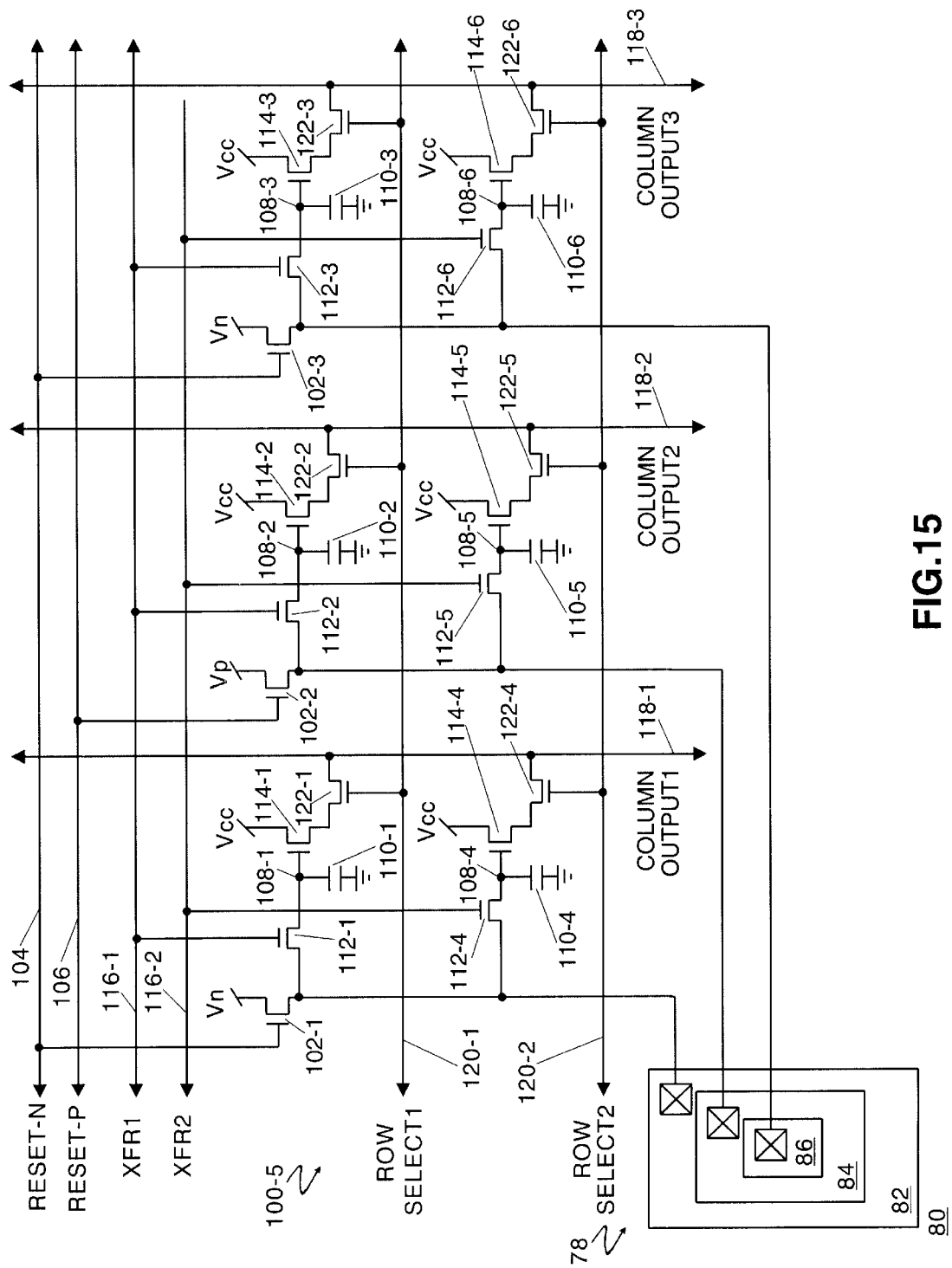
Figure 16A:
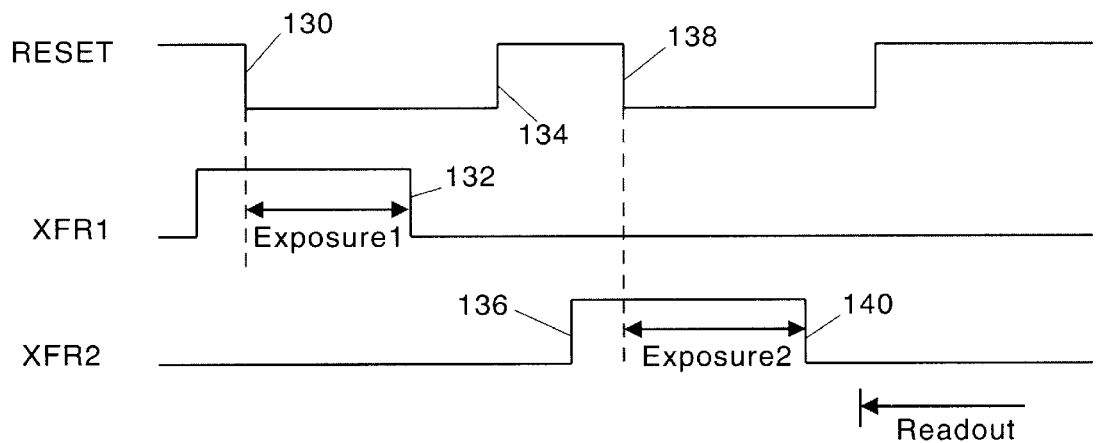
Figure 16B:
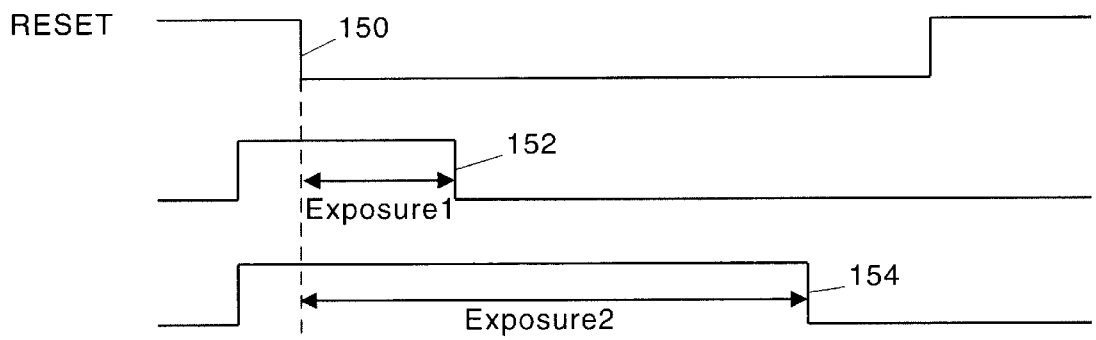

FIGS. 16A and 16B are alternative timing diagrams for the operation of the active pixel sensors depicted in FIG. 15 according to the present invention.

Figure 17:
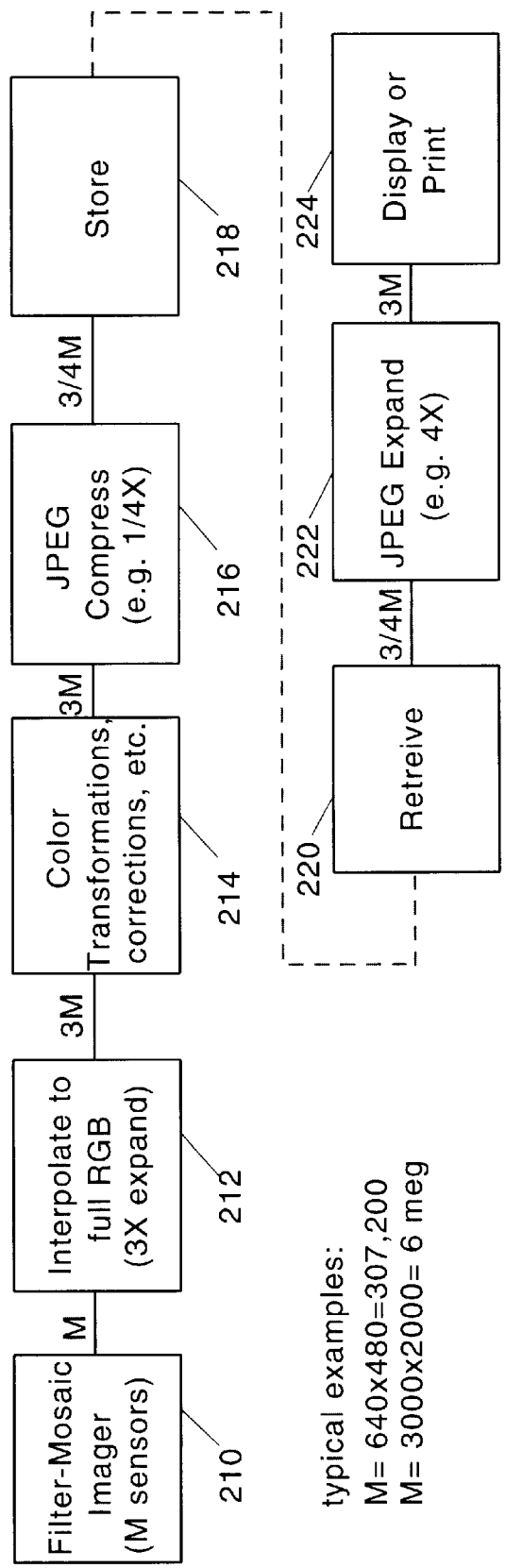

FIG. 17 is a block diagram of a prior-art image capture and display system showing the interpolation step, the lossy compression step, and the data storage, data retrieval, and decompression steps performed on three-color digital output data from the imaging array.

Figure 18A:
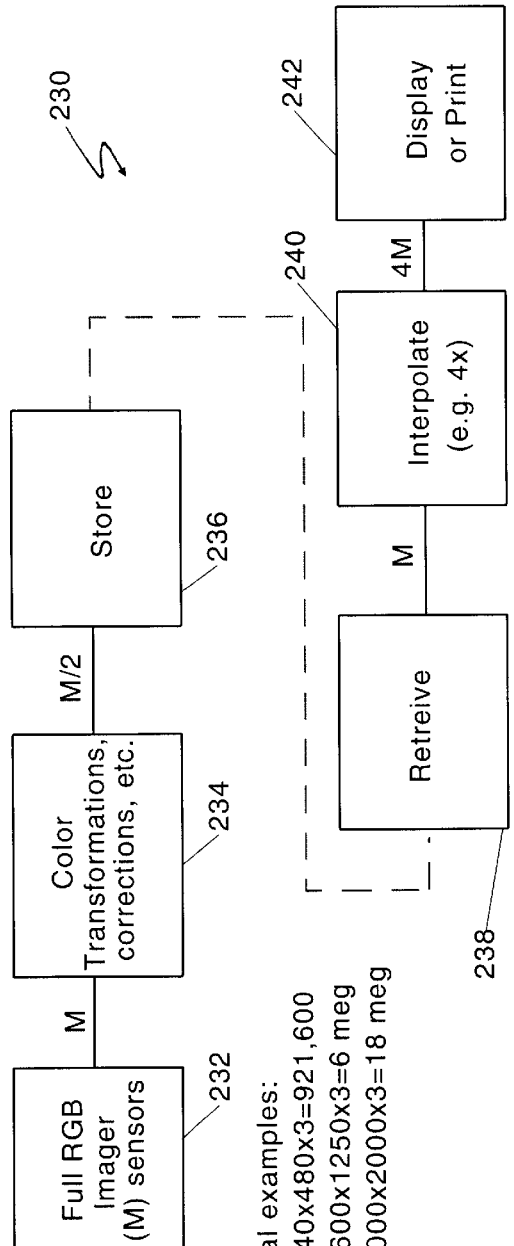
Figure 18B:
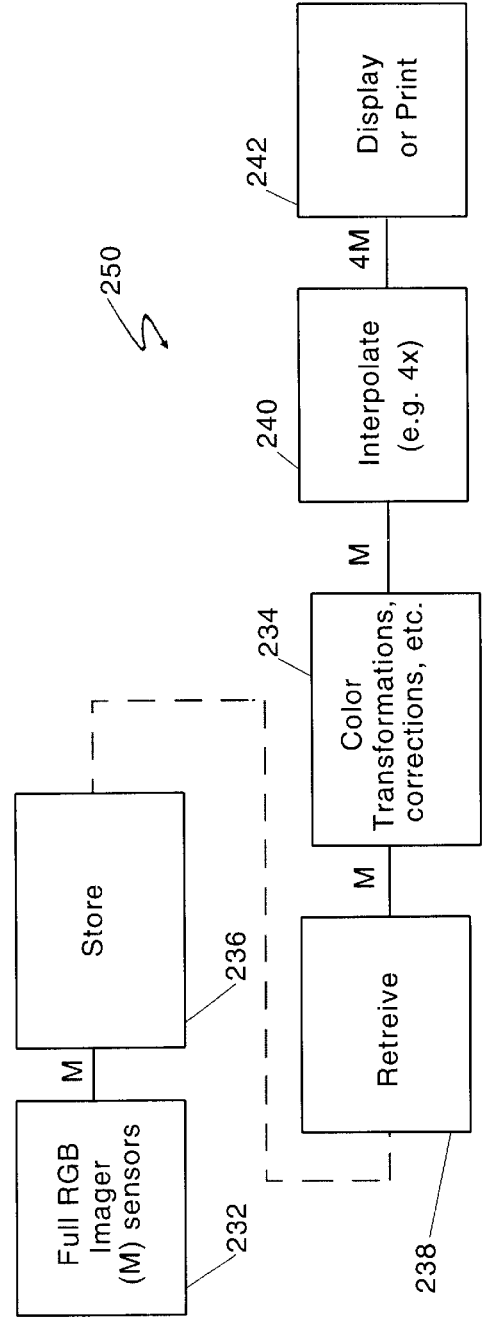

FIGS. 18A and 18B are block diagrams of alternate embodiments of an image capture and display system and method without compression according to the present invention.

FIGS. 19A and 19B are block diagrams of alternate embodiments of an image capture and display system and method using compression according to the present invention.

DETAILED DESCRIPTION OF A PREFERRED EMBODIMENT

Persons of ordinary skill in the art will realize that the following description of the present invention is illustrative only and not in any way limiting. Other embodiments of the invention will readily suggest themselves to such skilled persons having the benefit of this disclosure.

A full RGB imager suitable for use in the present invention is described in co-pending application Ser. No. 09/290, 361, filed on Apr. 12, 1999. Therein, an active pixel imaging array comprising a triple-junction structure is described. The advantage of a triple-junction structure is that each pixel in the array measures each primary color at the same location, thus minimizing or eliminating the need for interpolation.

A further advantage of using a full RGB imager is that all of the red, green and blue image information is captured for a single pixel is contained within a smaller space than in the pixel cluster of prior-art imaging systems, allowing for finer resolution. In a typical system according to the present invention, the full RGB imager may consist of, for example, an array of 640 by 480 three-layer RGB full-color pixel sensor, delivering a total of M=921,600 individual bytes of pixel data in the image dataset. An illustrative non-limiting example of a more dense imager that may be used according to this aspect of the present invention is an imager that may consist of an array of 3,000 pixel sensors by 2,000 pixel sensors, (×3 for R,G,B) for a total of M=18,000,000 bytes of pixel data in the image dataset. An alternative implementation of a full RGB imager is an assembly of three simple sensor arrays in a three-color color separation prism with the three arrays optically aligned to each other as is known in the art of video cameras.

The full RGB imager utilized in the present invention is directed to color separation in an active pixel MOS imaging array utilizing a triple-junction pixel cell structure to take advantage of the differences in absorption length in silicon of light of different wavelengths to measure different colors in the same location with sensitive areas almost as large as their spacing.

In the present invention a color photosensor structure that separates blue, green and red light is formed in a P-type silicon body. The color photosensor structure comprises a vertical PNPN device that implements a triple stacked photodiode and includes a first N-doped region formed in the P-type silicon body, a P-doped region formed in the first N-doped region, and a second N-doped region formed in the P-doped region. A triple well process is employed according to the present invention to fabricate the color photosenor structure. The normal N well of the triple well CMOS process is not employed in the color photosenor structure of the present invention, although it may be useful to use it on the same chip, outside of the array of imager cells.

In the color photosensor structure, the pn junction formed between the P-type silicon body and the first N-doped region defines a red-sensitive photodiode at a depth in the silicon approximately equal to the absorption length of red light in silicon, the pn junction formed between the first N-doped region and the P-doped region defines a green-sensitive photodiode at a depth in the silicon approximately equal to the absorption length of green light in silicon, and the pn junction formed between the P-doped region and the second N-doped region defines a blue-sensitive photodiode at a depth in the silicon approximately equal to the absorption length of blue light. Sensing circuitry is connected to the red, green and blue photodiodes to integrate and store respective photodiode currents.

The full RGB imager utilized in the present invention reduces color aliasing artifacts by ensuring that all pixels in an imaging array measure red, green and blue color response in the same place in the pixel structure. Color filtration takes place by making use of the differences in absorption length in silicon of the red, green and blue light.

The full RGB imager utilized in the present invention provides advantages in addition to reduction of color aliasing. For example, it eliminates the complex polymer color filter array process steps common in the prior art. Instead, a triple-junction process, which is commonly available in the semiconductor industry is used. Also, overall efficiency of use for available photons is increased. With the traditional approach, photons not being passed by the filter material are absorbed in the filter and wasted. With the approach of the present invention, the photons are separated by absorption depth, but are all collected and used. This can result in an overall improvement in quantum efficiently by around a factor of three.

The full RGB imager utilized in the present invention provides an excellent example of an imager that would be difficult to implement with conventional CCD technology. In addition, the present invention benefits from the availability of scaled CMOS processing, in the sense that there are many support transistors in each three-color pixel.

Semiconductor devices for measuring the color of light are known in the non-imaging art. These devices have been built with a variety of technologies that depend upon the variation of photon absorption depth with wavelength. Examples are disclosed in U.S. Pat. No. 4,011,016, enitled "Semiconductor Radiation Wavelength Detector" and U.S. Pat. No. 4,309,604, entitled "Apparatus for Sensing the Wavelength and Intensity of Light." Neither patent discloses either a structure for a three-color integrated circuit color sensor or an imaging array.

In the imaging art, CCD devices with multiple buried channels for accumulating and shifting photocharges are known. These devices are difficult and expensive to manufacture and have not been practical for three-color applications. U.S. Pat. No. 4,613,895, entitled "Color Responsive Imaging Device Employing Wavelength Dependent Semiconductor Optical Absorption" discloses an example of such a device. This category also includes devices that use layers of thin-film photosensitive materials applied on top of an imager integrated circuit. Examples of this technology are disclosed in U.S. Pat. No. 4,677,289, titled "Color Sensor" and U.S. Pat. No. 4,651,001, entitled "Visible/Infrared Imaging Device with Stacked Cell Structure." These structures are also difficult and expensive to make, and have not become practical.

Also known in the imaging art are color imaging integrated circuits that use a color filter mosaic to select different wavelength bands at different photosensor locations. U.S. Pat. No. 3,971,065, entitled "Color Imaging Array", discloses an example of this technology. As discussed by Parulski et al., "Enabling Technologies for Family of Digital Cameras", 156/SPIE Vol. 2654, 1996, one pixel mosaic pattern commonly utilized in digital cameras is the Bayer color filter array (CFA) pattern.

Figure 1:
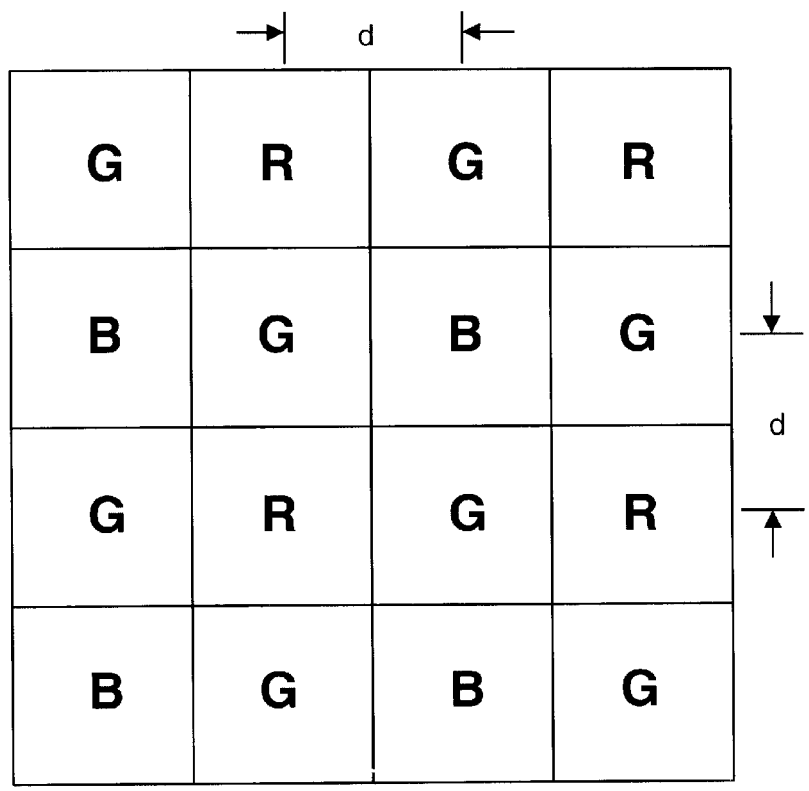
FIG. 1 illustrates the well-known Bayer color filter array (CFA) pattern.
Figure 2:
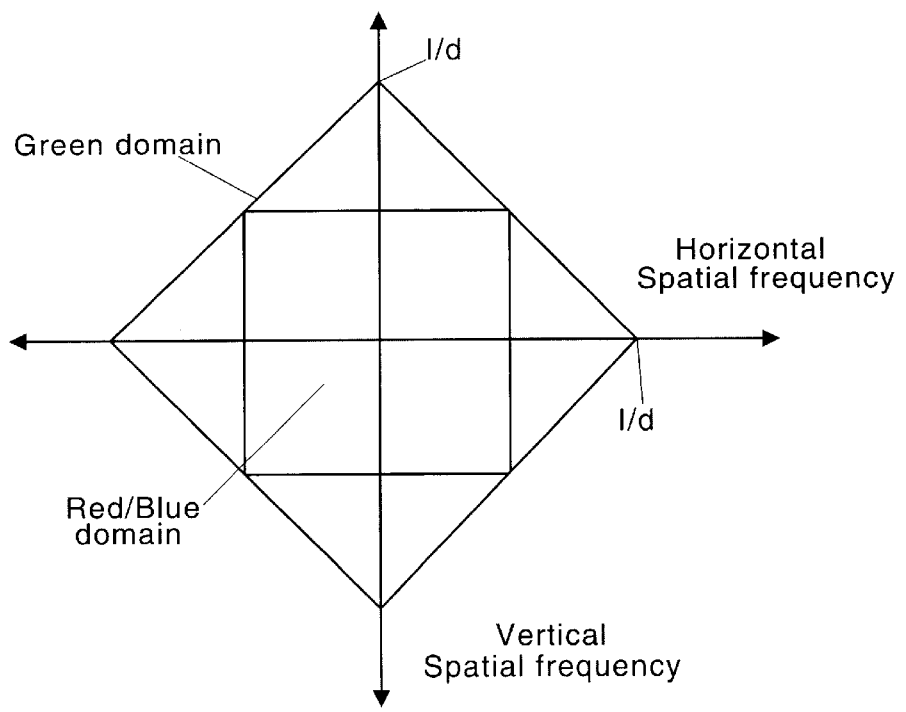
FIG. 2 illustrates the Nyquist domains for red, green and blue resulting from the Bayer CFA of FIG. 1.

Shown in FIG. 1, the Bayer CFA has 50% green pixels arranged in a checkerboard. Alternating lines of red and blue pixels are used to fill in the remainder of the pattern. As shown in FIG. 2, the Bayer CFA pattern results in a diamond-shaped Nyquist domain for green and smaller, rectangular-shaped Nyquist domains for red and blue. The human eye is more sensitive to high spatial frequencies in luminance than in chrominance, and luminance is composed primarily of green light. Therefore, since the Bayer CFA provides the same Nyquist frequency for the horizontal and vertical spatial frequencies as a monochrome imager, it improves the perceived sharpness of the digital image.

These mosaic approaches are known in the art to be associated with severe color aliasing problems due to the facts that the sensors are small compared to their spacing, so that they locally sample the image signal, and that the sensors for the different colors are in different locations, so that the samples do not align between colors. Image frequency components outside of the Nyquist domain are aliased into the sampled image with little attenuation and with little correlation between the colors.

As pointed out above in the discussion of CCD color imaging arrays, the semiconductor processes employed in manufacturing the arrays can be both difficult and expensive to implement. There are, however, CMOS technologies that are known which may be implemented with less expense and greater ease.

Figure 3:
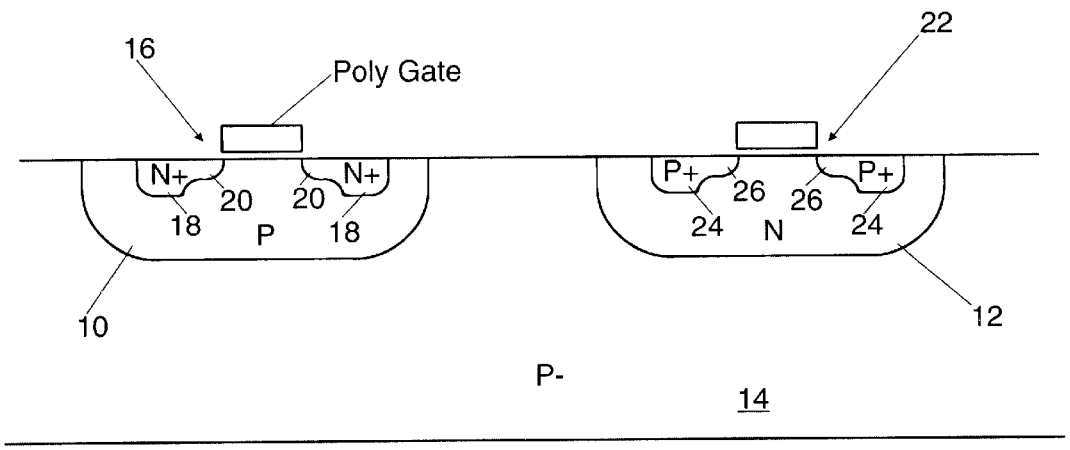
FIG. 3 is a partial cross-section drawing illustrating a conventional twin-well CMOS structure.

Referring to FIG. 3, many modern CMOS integrated circuit fabrication processes use a "twin-well" or "twin-tub" structure in which a P well region 10 and a N well region 12 of doping density approximately $10^{17}$ atoms/cm$^3$ are used as regions within which to make N-channel and P-channel transistors, respectively. The substrate material 14 is typically a more lightly doped P-type silicon ($10^{15}$ atoms/cm$^3$), so the P well 10 is not isolated from the substrate 14. The N-channel FET 16 formed in the P well 10 includes N+normal source/drain diffusions 18 at a dopant concentration of >$10^8$ atoms/cm$^3$ and N-type shallow lightly doped diffusion (LDD) regions 20 at a concentration of approximately $10^{18}$ atoms/cm$^3$. The P-channel FET 22 formed in the N well region 12 is similarly constructed using normal P+source/drain regions 24 and shallow LDD regions 26 of similar dopant concentrations.

Figure 4:
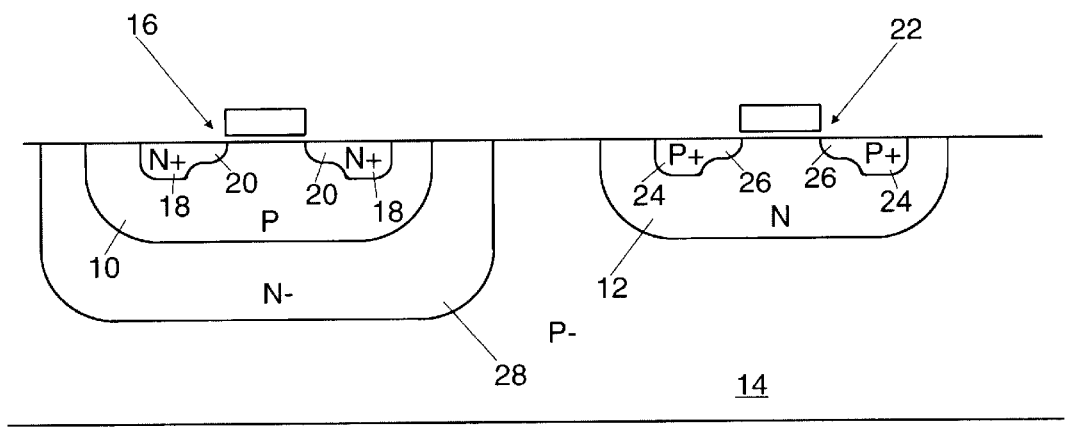
FIG. 4 is a partial cross-section drawing illustrating a conventional triple-junction CMOS structure.

Referring to FIG. 4, in an improved process, known as "triple well", an additional deep N isolation well 28 is used to provide junction isolation of the P well 10 from the P substrate 14. The dopant density of the N isolation well 28 ($10^{16}$ atoms/cm$^3$) lies between the dopant densities of P substrate 14 and P well 10 ($10^{15}$ atoms/cm$^3$ and $10^{17}$ atoms/cm$^3$, respectively). U.S. Pat. No. 5,397,734, entitled "Method of Fabricating a Semiconductor Device Having a Triple Well Structure", discloses an example of triple well technology.

Triple well processes are becoming popular and economical for manufacturing MOS memory (DRAM) devices, since they provide effective isolation of dynamic charge storage nodes from stray minority carriers that may be diffusing through the substrate.

Storage pixel sensors are also known in the art. In a storage pixel, data representing intensity of light received by a phototransducer are stored in a storage element that can be read out and cleared using appropriate control circuitry.

Figure 5:
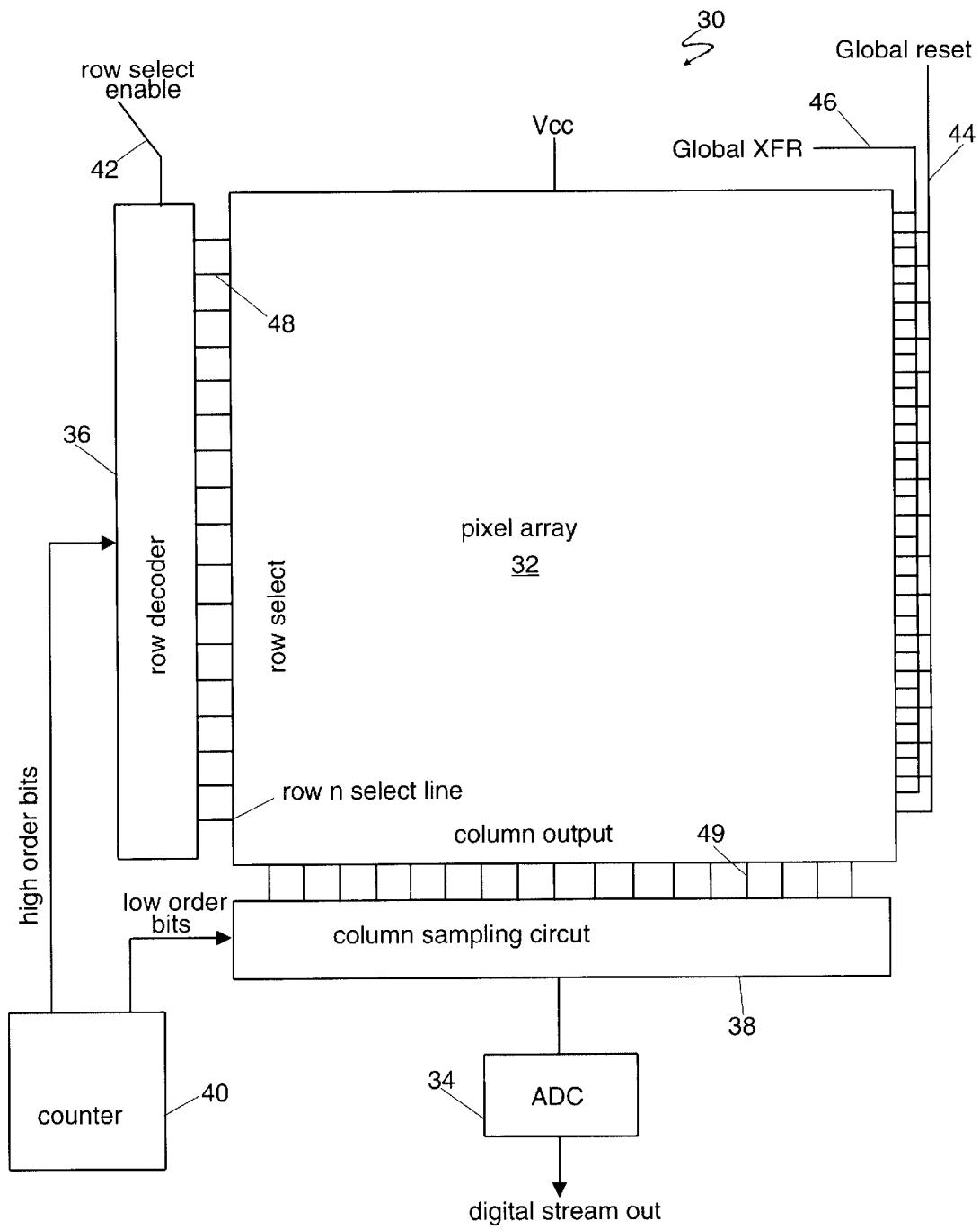
FIG. 5 is a block diagram of an imager suitable for use with the embodiments of active pixel sensors according to the present invention

FIG. 5 is a block diagram of an active pixel imager 30 suitable for use according to the present invention. In the imager 30, the active pixel sensors are arranged in rows and columns in a pixel sensor array 32. To extract the analog pixel information from the pixel sensor array 32 for processing by an analog-to-digital converter (ADC) 34, a row decoder circuit 36, a column sampling circuit 38, and a counter 40 are employed. The row decoder 34 selects rows from the pixel sensor array 32 in response to a row enable signal 42 and signals from the counter 40. The column sampling circuit 38 is also driven from the counter 40 and further includes a multiplexer that couples the sampled columns as desired to the ADC in response to signals from counter 40.

In a typical implementation, the higher-order bits from counter 40 are used to drive the row decoder circuit 36 and the lower-order bits are used to drive column sampling circuit 38 to permit extraction of all pixel information from a row in the pixel sensor array 32 prior to selection of the next row by row decoder circuit 36. Row decoders, column sampling circuits with embedded multiplexers, and counters suitable for use in the imager 30 are well known to those of ordinary skill in the art, and will not be described herein in detail to avoid overcomplicating the disclosure and thereby obscuring the present invention.

Figure 6:
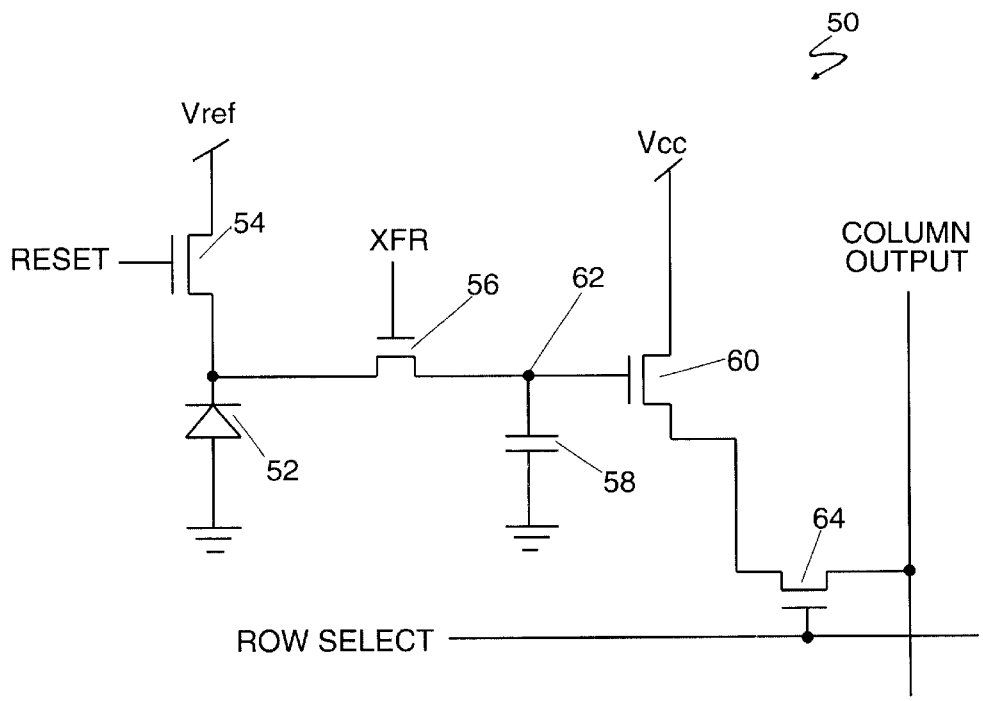
FIG. 6 is a schematic diagram of an N-channel MOS implementation of a known active pixel sensor circuit having a single storage node.

Referring now to FIG. 6, a schematic diagram of a known active pixel sensor 50 with a single embedded storage element is shown. The active pixel sensor 50 is implemented with N-channel MOS transistors. Those of ordinary skill in the art will appreciate that the active pixel sensor 50 may otherwise be implemented with all P-channel MOS transistors or a combination of P-channel and N-channel MOS transistors. In active pixel sensor 50, a photodiode 52 has an anode connected to ground and a cathode connected to the source of N-Channel MOS reset transistor 54. The drain of N-Channel MOS reset transistor 54 is connected to Vref and the gate of N-Channel MOS reset transistor 54 is connected to the global RESET line indicated by reference numeral 44 in FIG. 5. The RESET line is preferably driven to a voltage at least a threshold above Vref to set the cathode of the photodiode 52 to Vref.

The cathode of photodiode 52 is also connected to a first source/drain of N-channel MOS transfer transistor 56. A second source/drain of N-Channel MOS transfer transistor 56 is connected to a first terminal of a storage element 58 and also to the gate of N-channel MOS readout transistor 60. A second terminal of the storage element 58 is connected to reference potential shown as ground. The gate of N-Channel MOS transfer transistor 56 is connected to the global XFR line indicated by reference numeral 46 in FIG. 5. The connection of the second source/drain of N-Channel MOS transfer transistor 56 to the first terminal of storage element 58 and also to the gate of N-Channel MOS transistor 60 forms a storage node 62. The drain of N-channel MOS readout transistor 60 is connected to Vcc, and the source of N-channel MOS readout transistor 60 is connected to the drain of N-channel MOS row select transistor 64. The gate of N-channel MOS row select transistor 64 is connected to a ROW SELECT line, one of which is depicted by reference numeral 48 in FIG. 5, and the source of N-channel MOS row select transistor 64 is connected to a column output line.

It should be appreciated that associated with the storage node 62 are the N-channel MOS transfer transistor 56 to isolate the storage node 62 from further collection of photocharge by the cathode of photodiode 52 when an integration period to be described below has ended, the N-channel MOS readout transistor 60 to sense the charge accumulated at storage node 62, and the storage element 58 to store charge. Further, as disclosed in co-pending application Ser. No. 09/099,116, entitled "ACTIVE PIXEL SENSOR WITH BOOTSTRAP AMPLIFICATION", by inventors R. B. Merrill and Richard F. Lyon, filed on Jun. 17, 1998, and assigned to the same assignee as the present invention, and expressly incorporated herein by reference, the storage element 58 may be omitted and charge stored on the gate of N-channel MOS readout transistor 60 or that other capacitive means of charge storage may be employed.

Figure 7:
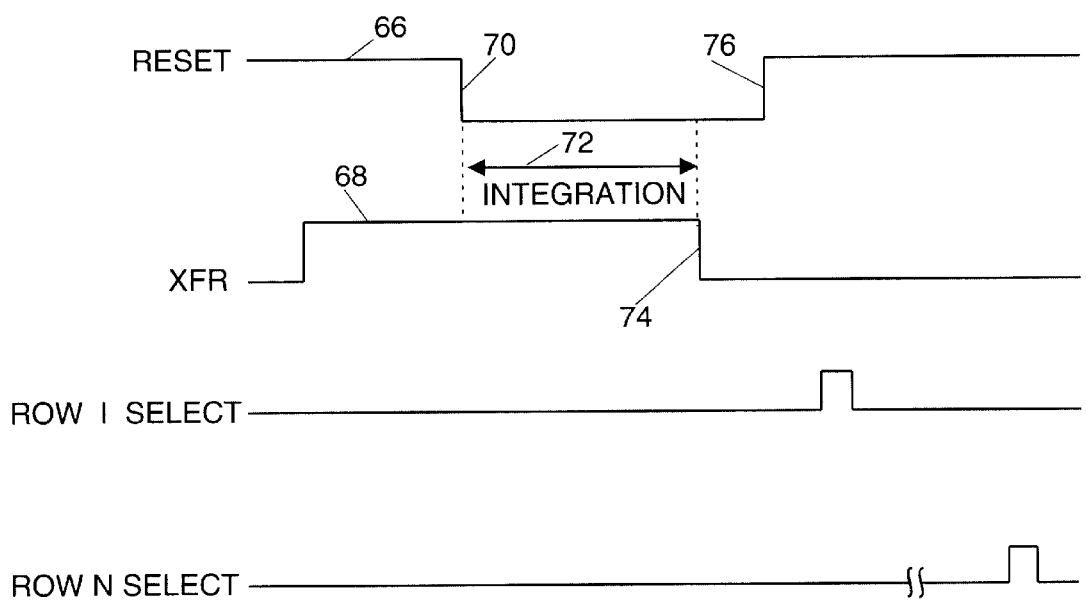
FIG. 7 is a timing diagram illustrating the operation of the active pixel sensor depicted in FIG. 6.

To better understand the operation of the active pixel sensor 50, the timing diagram of FIG. 7 illustrates the timing of the RESET, XFR and ROW SELECT signals depicted in FIG. 6. The active pixel 50 is reset by turning on both N-channel MOS reset transistor 54 and N-channel MOS transfer transistor 56 as shown by the HIGH level of both the RESET and XFR signals at 66 and 68. Then the N-channel MOS reset transistor 54 is turned off at the falling edge 70 of RESET 66 so that integration of photocurrent from photodiode 52 can begin. The photocurrent integration period is indicated by reference numeral 72.

While N-channel MOS transfer transistor 56 is turned on, the capacitance of the storage element 58 adds to the capacitance of the photodiode 52 during integration, thereby increasing the charge capacity and the range of the active pixel sensor 50. This also reduces variation in the pixel output due to capacitance fluctuations since gate oxide capacitance from which storage element 58 is formed is better controlled than junction capacitance of the photodiode 52.

When the integration is complete (determined by external exposure control), the N-channel MOS transfer transistor 56 turns off at falling edge 74 of XFR to isolate the voltage level corresponding to the integrated photocharge onto the storage element 58. Shortly thereafter, the photodiode 52 itself is preferably reset to the reference voltage by again turning on N-channel MOS reset transistor 54 as indicated by rising edge 76 of RESET. This action will prevent the photodiode 52 from continuing to integrate during the read out process and possibly overflowing excess charge into the body, possibly affecting the integrity of the signal on the storage element 58.

After the N-channel MOS transfer transistor 56 is turned off, the read out process can begin. Each of the active pixel sensors in a row is read when a ROW SELECT signal pulse as shown in FIG. 7 is applied to the gate of the N-channel MOS row select transistor 64 in an active pixel sensor 60. In the operation of active pixel sensor 50, a voltage related to the voltage found on storage node 62 is sensed by N-Channel MOS readout transistor 50 and placed on the column output line when N-channel row select transistor 64 is turned on. The XFR signal stays low until all of the rows have been read out or another cycle is initiated.

Figure 8:
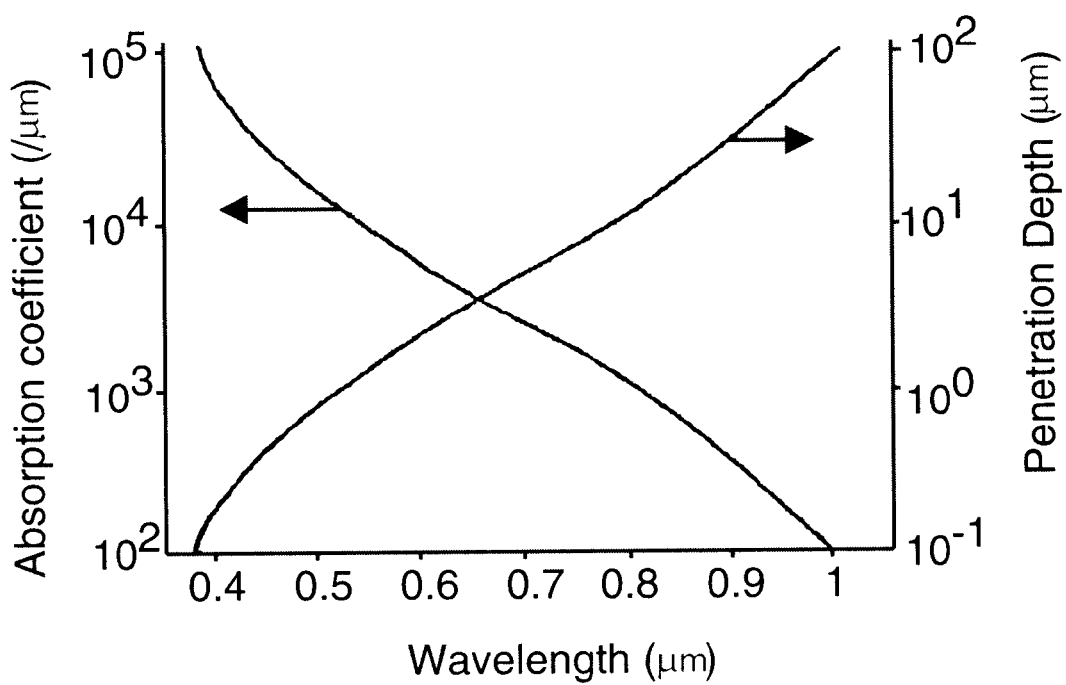
FIG. 8 is a graph plotting light absorption length in silicon versus wavelength.

FIG. 8 illustrates the light absorption length in silicon for light in the visible spectrum. It is well known that the longer the wavelength of light incident upon a silicon body, the deeper the light will penetrate into the silicon body before it is absorbed. As depicted, blue light having wavelengths in the range of about 400–490 nm will be absorbed in a silicon body primarily at a depth of about 0.2–0.5 microns, green light having wavelengths in the range of about 490–575 nm will be absorbed in the silicon body at a depth of about 0.5–1.5 microns, and red light having wavelengths in the range of about 575–700 nm will be absorbed in the silicon at a depth of about 1.5–3.0 microns.

Figure 9:
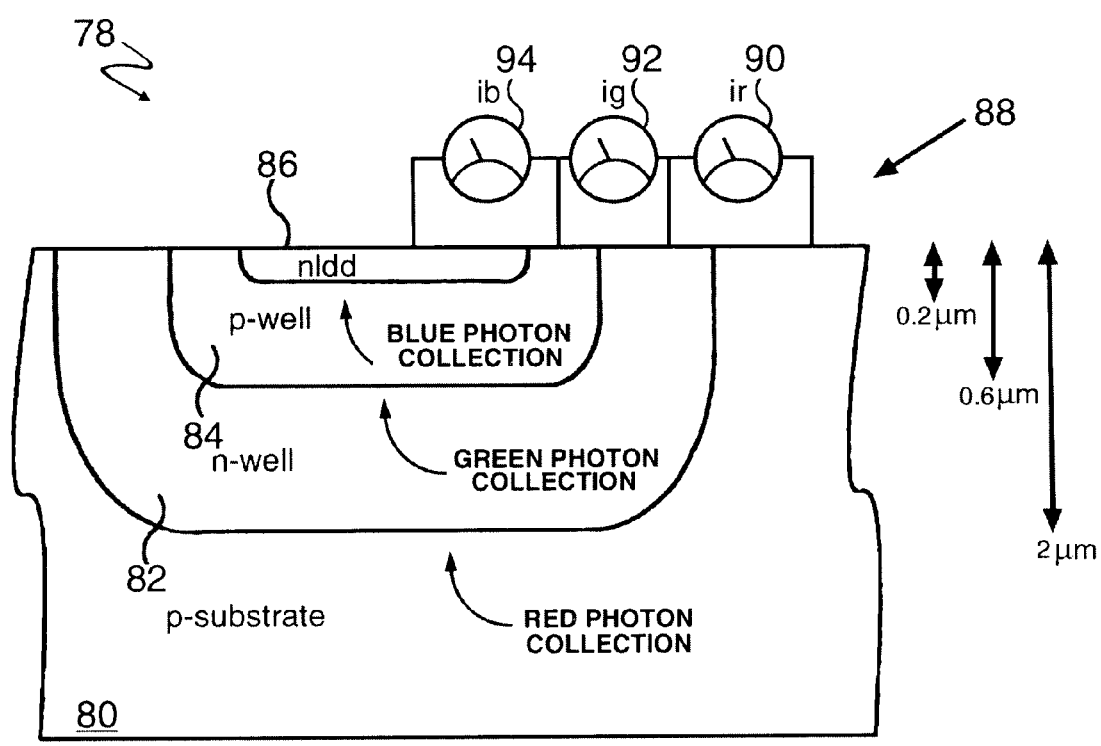
FIG. 9 is a partial cross-section drawing illustrating a three-color pixel sensor using a triple-junction structure in accordance with the concepts of the present invention.

In FIG. 9, according to the present invention, a triple-junction color photosensor structure 78 formed in a silicon body 80 of P-type conductivity (approx. 1015 atoms/cm2) is illustrated. The color photosensor structure 78 includes a first N-type doped well region 82 (approx. 1016 atoms/cm3) formed in the P-type silicon body 80, a doped well region 84 of P-type conductivity (approx. 1017 atoms/cm3) formed in the first N-doped region 82, and a second doped region 86 of N-type conductivity (approx. 1018 atoms/cm3) formed as a very shallow NLDD (N-type lightly doped drain) layer in the P-doped region 84.

Three pn junctions exist in the color photosensor structure 78. A first pn junction exists between the P-type silicon body 80 and the first N-doped region 82 at a depth of about 1.5 to about 3.0 microns. The first pn junction is preferably formed at the approximate absorption depth for red light of about 2 microns. A second pn junction exists between the P-doped region 84 and the first N-doped region 82 at a depth between about 0.5 to about 1.5 microns. The second pn junction is preferably formed at the approximate absorption depth for green light of about 0.6 microns. A third pn junction exists between the P-doped region 84 and the second N-doped region 86 at a depth of about 0.2 to about 0.5 microns. The third pn junction is preferably formed at the approximate absorption depth for blue light of about 0.2 microns. Accordingly, in the color photosensor structure 78, the first pn junction forms a red-sensitive photodiode, the second pn junction forms a green-sensitive photodiode, and the third pn junction forms a blue-sensitive photodiode.

Those skilled in the art will appreciate that the sensitive depletion regions of the diodes described above extends somewhat above and below their junction depths. Such skilled persons will also appreciate that the above-described triple-junction structure can be implemented using regions of opposite conductivities than disclosed in the example of FIG. 9, i.e., a first P-doped region in an N-type silicon substrate, an N-doped region in the first P-region and a second P-doped region in the N-region. However, such a structure is usually not used in the industry, and the structure of FIG. 9 is preferred since it uses standard triple-junction MOS memory technology. Additionally, persons of ordinary skill in the art will appreciate that additional pn junctions could be formed at selected depths in the color photosensor structure 78 by forming additional doped regions to provide for the absorption of photons at additional selected wavelengths.

FIG. 9 further shows that the color photosensor structure of the present invention also includes a sensing mechanism 88 connected to the red, green and blue photodiodes for measuring red, green and blue photocurrents, respectively, across the three photodiodes. The photocurrent sensor 88 is illustrated as a conceptual arrangement that includes a first current meter 90 connected across the red-sensitive photodiode for measuring the red photocurrent ir. A second current meter 92 is connected across the green-sensitive photodiode for measuring the green photocurrent ig. A third current meter 94 is connected across the blue-sensitive photodiode for measuring the blue photocurrent ib. Assuming that most of the current in the photodiodes is collected in their depletion regions, those skilled in the art will clearly appreciate that the current ib will be primarily photocurrent of incident photons from the blue end of the visible spectrum, the current ig will be primarily current from green photons, and the current ir will be primarily current from red photons.

Figure 10:
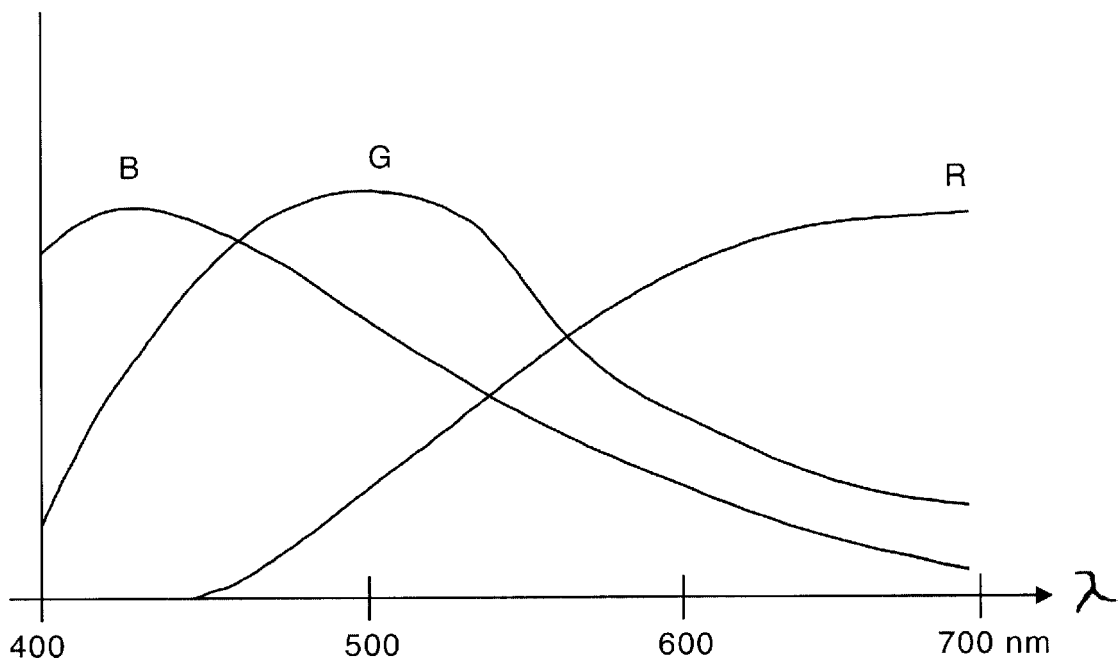
FIG. 10 is a graph showing a set of estimated sensitivity curves for the FIG. 8 triple-junction photodiode structure in accordance with the present invention.

FIG. 10 presents a set of estimated sensitivity curves for the triple stacked photodiode arrangement of the present invention, as a function of wavelength within the visible spectrum. The curves are only rather broadly tuned, as shown, rather than sharply tuned as in some other color separation approaches that are based on color filters. However, as is well known in the art of color imaging, it is possible with suitable matrixing to convert three measurements from such a set of curves into a more nearly colorimetrically correct set of red, green, and blue intensity values. Methods for estimating suitable matrix transformations are known in the art, and are disclosed, for example in U.S. Pat. No. 5,668,596, entitled "Digital Imaging Device Optimized for Color Performance."

According to the present invention, an imager 30 such as that illustrated in FIG. 5 has multiple storage nodes associated with each of the pixels in the pixel array 32. To capture a color image in the imager 30, each of the pixels employs the triple-photodiode color sensor structure 78 described with reference to FIG. 9. In each of the embodiments according to the present invention of the storage pixel sensors 100-1 through 100-5 depicted in FIGS. 11 through 15 herein, each of the three diodes in the triple-diode color photosensor structure 78 has a terminal that is coupled to at least one separate storage and readout circuit. The embodiments of storage pixel sensors 100-1 through 100-5 depicted in FIGS. 11 through 15 are implemented with N-channel MOS transistors. Those of ordinary skill in the art will appreciate that the storage pixel sensors below may otherwise be implemented with P-channel MOS transistors or a combination of N-channel and P-channel MOS transistors. Corresponding elements depicted in FIGS. 11 through 15 will be identified by the same reference numerals.

In the operation of the active pixel sensors 100-1 through 100-4 of FIGS. 11 through 14, the active pixel sensors are reset and charge is accumulated in a manner similar to that described above with respect to the pixel sensor of FIG. 6. For the operation of active pixel sensor 100-5, alternative timing diagrams are depicted in FIGS. 16A and 16B.

In each of the embodiments of the active pixel sensors 100-1 through 100-5, the first N-doped region 82 is coupled to a source of N-channel MOS reset transistor 102-1, the P-doped region 84 is coupled to a drain of N-channel MOS reset transistor 102-2, and the second N-doped region 86 is coupled to a source of N-channel MOS reset transistor 102-3. The drains of N-channel MOS reset transistors 102-1 and 102-3 are coupled to reference voltage Vn, and the source of N-channel MOS reset transistor 102-2 is coupled to a reference voltage Vp<Vn. The gates of N-channel MOS reset transistors 102-1 and 102-3 are connected to a RESET-N control line 104, and the gate of N-Channel MOS reset transistor 102-2 is connected to a RESET-P control line 106.

The potential Vn coupled to the drains of N-channel MOS reset transistors 102-1 and 102-3 are substantially positive with respect to the P-type silicon substrate, and the potential Vp coupled to the drain of N-Channel MOS reset transistor 102-2 is less positive than Vn, so that all three photodiodes start out in a reverse biased state when the RESET-N and RESET-P signals are applied. As the photodiodes in the triple-diode color photosensor structure 78 are exposed to light, they become less reverse biased, and can even become somewhat forward biased before they "overflow." The three voltages sensed will correspond to different linear combinations of the photocharges, depending on the values of the various photodiodes and stray capacitances of the circuit. These linear combinations affect the resulting sensitivity curves for the voltage output and, hence, are corrected for in the matrix transformation that follows to produce a calorimetrically sensible final output.

Further, the active pixel sensors 100-1 through 100-5 each include a plurality of storage nodes 108-1, 108-2 and 108-3. For example, storage node 108-1 comprises the common connection of the first terminal of a storage element 110-1, a first source/drain of N-channel MOS transfer transistor 112-1, and the gate of N-channel MOS readout transistor 114-1. Storage node 108-2 comprises the common connection of the first terminal of storage element 110-2, a first source/drain of N-channel MOS transfer transistor 112-2, and the gate of N-channel MOS readout transistor 114-2. Storage node 108-3 comprises the common connection of the first terminal of a storage element 110-3, a first source/drain of N-channel MOS transfer transistor 112-3, and the gate of N-channel MOS readout transistor 114-3. The gates of N-channel MOS transfer transistors 112-1, 112-2 and 112-3 are connected to a global transfer signal on XFR line 116. The storage elements 110-1, 110-2, and 110-3 each have a second terminal connected to a fixed potential shown as ground.

Figure 11:
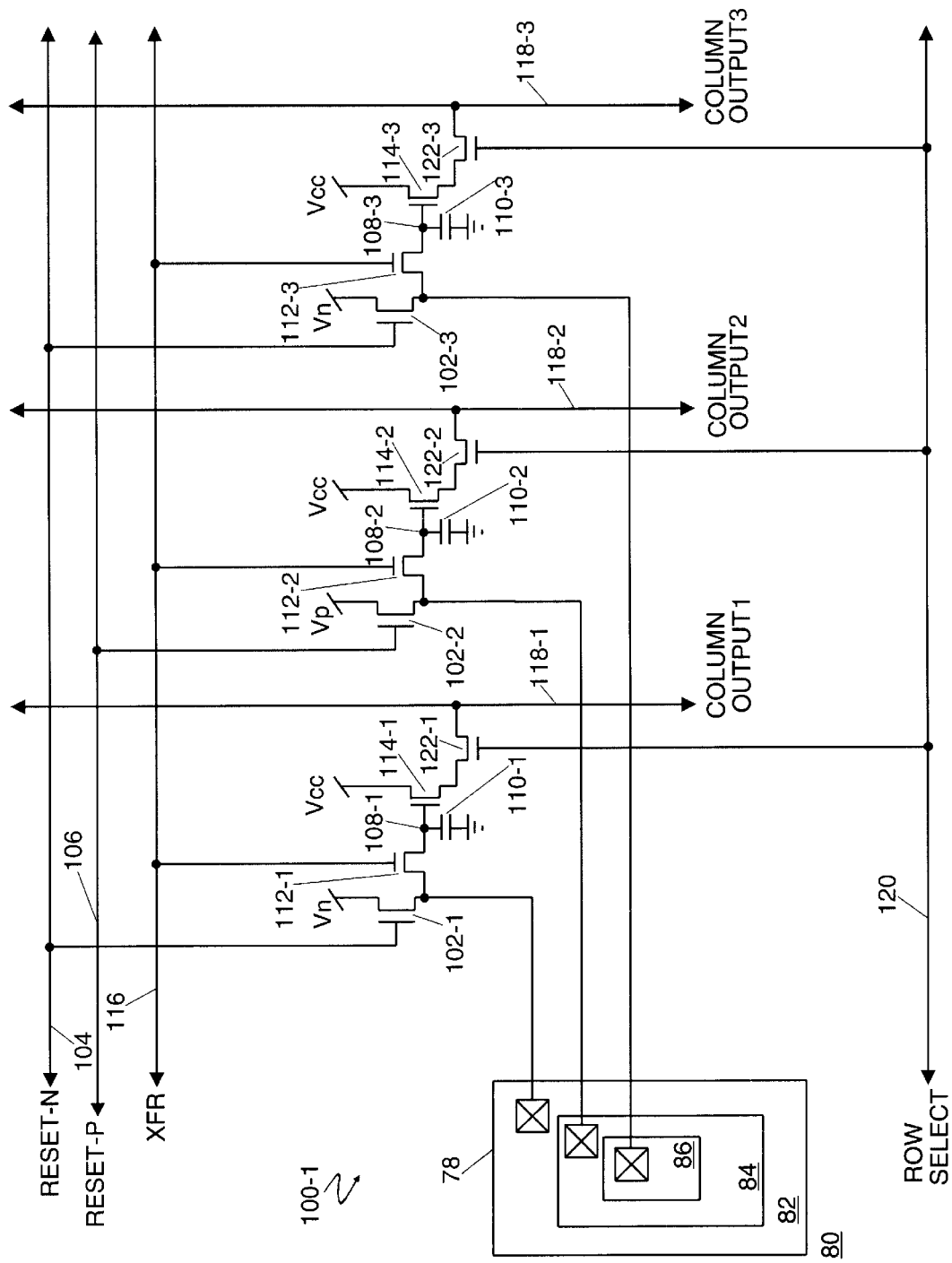

Referring to the embodiment 100-1 of an active pixel sensor according to the present invention as seen in FIG. 11, voltages present on storage nodes 108-1 through 108-3 are read out onto separate column output lines 118-1 through 118-3, respectively, by a single row select signal on ROW SELECT line 120. Accordingly, the drain of each N-channel MOS readout transistor 114-1 through 114-3 is connected to Vcc, and the source of each N-channel MOS readout transistor 114-1 through 114-3 is connected to the drain of one of N-channel MOS row select transistors 122-1 through 122-3, respectively. The gates of N-channel MOS row select transistors 122-1 through 122-3 are each connected to the ROW SELECT line 120, and the sources of N-channel MOS row select transistors 122-1 through 122-3 are connected to the column output lines 181-1 through 118-3, respectively.

In the operation of the active pixel sensor 100-1, during the reading out of the images on the column output lines 118-1 through 118-3, column circuits (not shown) connected to the column output lines 118-1 through 118-3, respectively, may be used to select a pixels representing a stored image provided on the storage nodes 108-1 through 108-3. Further, column circuits may be used to perform some function on the stored pixels, such as performing a linear combination of the sensed color signals.

Figure 12:
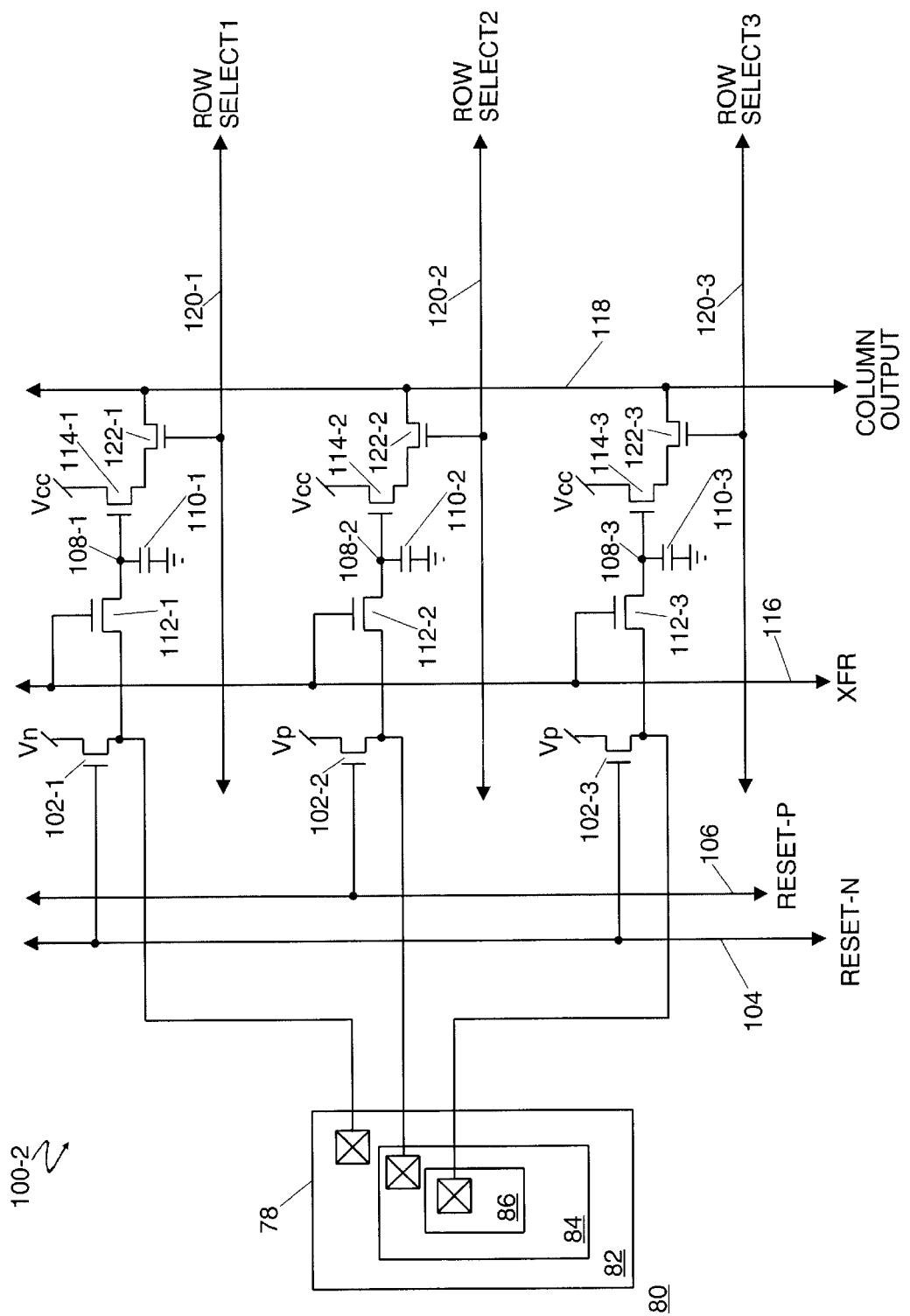

Referring now to FIG. 12, in the embodiment 100-2 of an active pixel sensor according to the present invention, voltages present on the storage nodes 108-1 through 108-3 are read out separately onto the same column output line 118, by separately asserting ROW SELECT1 through ROW SELECT3 signals. Accordingly, the drain of each N-channel MOS readout transistor 114-1 through 114-3 is connected to Vcc, and the source of each N-channel MOS readout transistor 114-1 through 114-3 is connected to the drain of N-channel MOS row select transistors 122-1 through 122-3, respectively. The gates of N-channel MOS row select transistors 122-1 through 122-3 are each connected to respective ones of ROW SELECT1 through ROW SELECT3 lines 120-1 through 120-3, respectively, and the sources of N-channel MOS row select transistors 122-1 through 122-3 are connected to the single column output line 118.

In the operation of active pixel sensor 100-2 of FIG. 12, the image stored on storage node 108-1 will be read out in response to a HIGH ROW SELECT1 signal, the image stored on storage node 108-2 will be read out in response to a HIGH ROW SELECT2 signal, and the image stored on storage node 108-3 will be read out in response to a HIGH ROW SELECT3 signal. It should be understood that the imager 30 depicted in FIG. 5 will further include additional decoding circuits for providing the signals on ROW SELECT1 through ROW SELECT3 lines.

Figure 13:
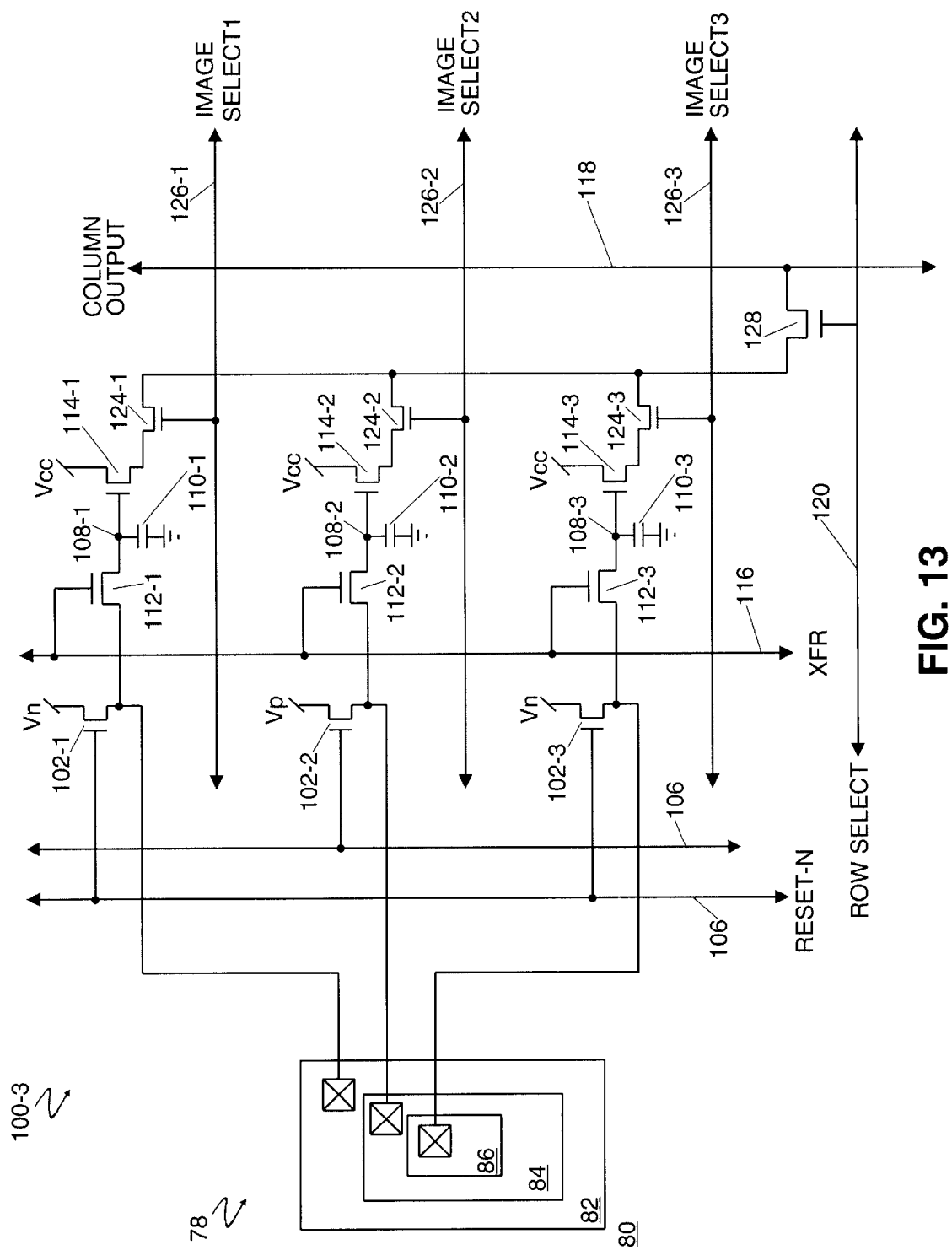

Referring now to FIG. 13, in the active pixel sensor embodiment 100-3, voltages present on storage nodes 108-1 through 108-3 are read out separately onto a single column output line 118 in response to signals on IMAGE SELECT1 through IMAGE SELECT3 lines 126-1 through 126-3, applied to the gates of N-channel MOS image select transistors 124-1 through 124-3, respectively, and a signal on ROW SELECT line 120. Accordingly, the drains of N-channel MOS readout transistors 114-1 through 114-3 are each connected to Vcc, and the sources of N-channel MOS readout transistors 114-1 through 114-3 are connected to the drains of N-channel MOS image select transistors 124-1 through 124-3, respectively. The gates of N-channel MOS image select transistors 124-1 through 124-3 are connected to IMAGE SELECT1 through IMAGE SELECT3 lines 126-1 through 126-3, respectively. The sources of N-channel MOS image select transistors 124-1 through 124-3 are all connected to the drain of N-channel MOS row select transistors 128. The gate of N-channel MOS row select transistor 128 is connected to a ROW SELECT line 120, and the source of N-channel MOS row select transistor 128 is connected to a column output line 118.

In the operation of active pixel sensor 100-3, the image stored on storage node 108-1 will be read out in response to a high signal asserted on ROW SELECT line 120 and a high signal asserted n IMAGE SELECT1 line 126-1. The image stored on storage node 108-2 will be read out in response to a high signal asserted on ROW SELECT line 120 and a high signal asserted on IMAGE SELECT2 line 126-2. The image stored on storage node 108-3 will be read out in response to a high signal asserted on ROW SELECT line 120 and a high signal asserted on IMAGE SELECT3 line 126-3. It should be understood that the imager 30 depicted in FIG. 5 will further include global IMAGE SELECT1 through IMAGE SELECT3 lines. The use of the global IMAGE SELECT1 through IMAGE SELECT3 signals in combination with the ROW SELECT signal eliminates the need for the additional row decoding required in the embodiment of FIG. 12.

Figure 14:
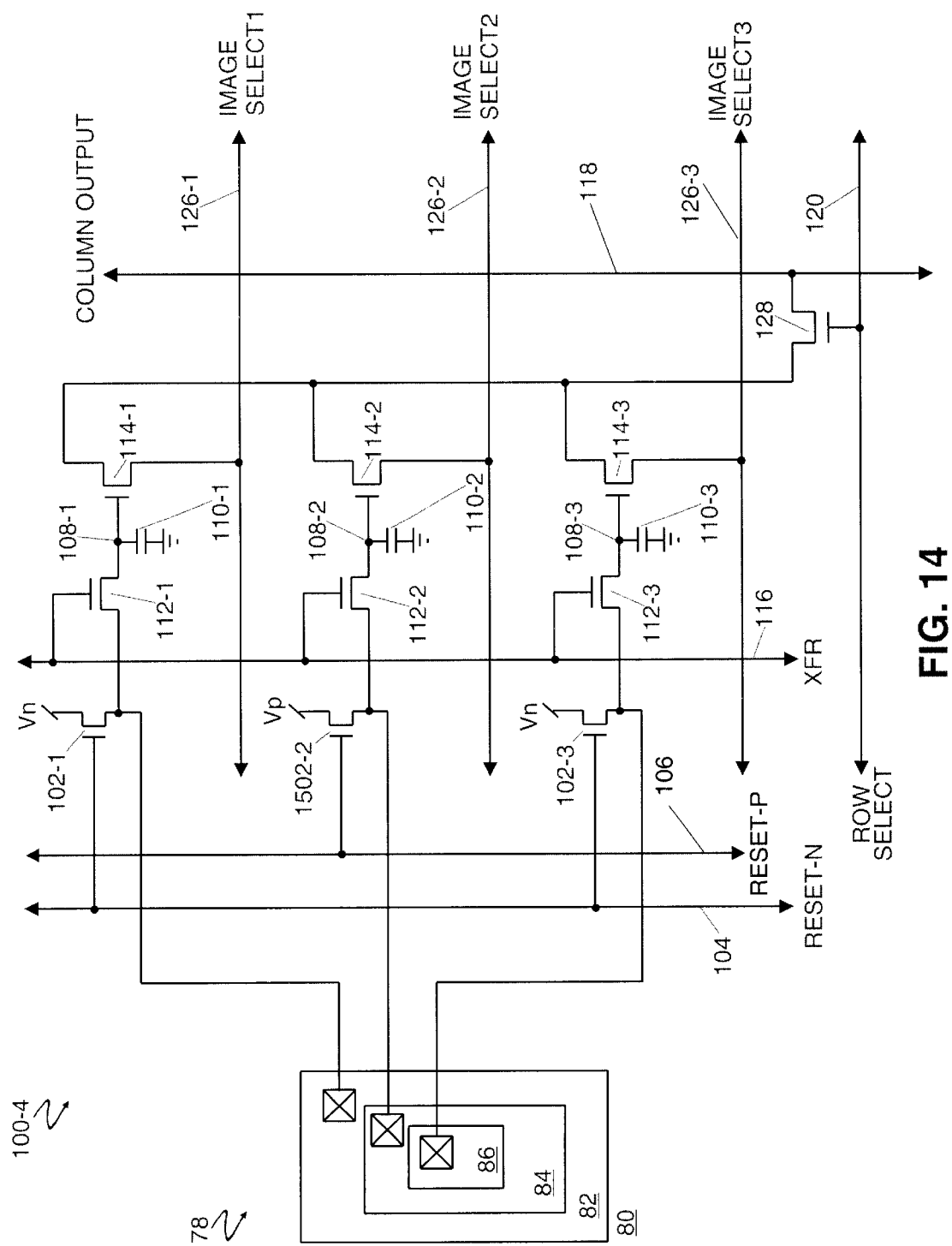

Referring now to FIG. 14, in the active pixel sensor embodiment 100-4, voltages present on storage nodes 108-1 through 108-3 are read out in a current mode onto a single column output line 118 in response to signals asserted on IMAGE SELECT1 through IMAGE SELECT3 lines 126-1 through 126-3, respectively, and a signal asserted on ROW SELECT line 120. Accordingly, the drains of N-channel MOS readout transistors 114-1 through 114-3 are connected together, and to the source of an N-channel MOS row select transistor 128. The sources of N-channel MOS readout transistors 112-1 through 114-3 are connected to IMAGE SELECT1 through IMAGE SELECT3 lines 126-1 through 126-3, respectively. The gate of N-channel MOS row select transistor 128 is connected to a ROW SELECT line 120, and the drain of N-channel MOS row select transistor 128 is connected to a column output line 118.

In the operation of active pixel sensor 100-4, the column output line 118 is connected to the drain of the N-channel MOS row select transistor 128. To place current representing the stored image on the column output line 118, the image stored at storage node 108-1 will be selected by a low signal asserted on IMAGE SELECT1 line 126-1, the image stored at storage node 108-2 will be selected by a low signal asserted on IMAGE SELECT2 line 126-2, and the image stored at storage node 108-3 will be selected by a low signal asserted on IMAGE SELECT3 line 126-3. The current-mode output on column output line 128 is therefore controlled by the signals on IMAGE SELECT1 through IMAGE SELECT3 lines 126-1 through 126-3. The column output line 128 output must be kept biased to a high enough voltage that the non-selected N-channel MOS readout transistors 114-1 through 114-3 do not start conducting backward. Further, it should be appreciated that the voltage drivers for the IMAGE Select1 through IMAGE SELECT3 lines 126-1 through 126-3 must be capable of sinking all the column current from the selected row.

Referring now to FIG. 15, an active pixel sensor embodiment 100-5 is seen to resemble the embodiment of FIG. 11 and includes additional storage nodes to demonstrate that the multiple storage nodes may be matrixed using ROW SELECT1 through ROW SELECT2 and COLUMN OUPUT1 through COLUMN OUTPUT3. In most respects, the embodiment of FIG. 15 functions in the same manner as the embodiment of FIG. 11.

In the active pixel sensor 100-5 shown in FIG. 15, the voltages present on storage nodes 108-1 through 108-3 are read out onto column output lines 118-1 through 118-3, respectively, by the signal on ROW SELECT1 line 120-1, and the voltages present on storage nodes 108-4 through 108-6 are read out onto column output lines 118-1 through 118-3, respectively, by the signal on ROW SELECT2 line 120-2. Accordingly, the drain of each N-channel MOS readout transistors 114-1 through 114-6 are connected to Vcc, and the source of each N-channel MOS readout transistor 114-1 through 114-6 is connected to the drain of an N-channel MOS row select transistor 122-1 through 122-6, respectively. The gates of N-channel MOS row select transistors 122-1 through 122-3 are each connected to the ROW SELECT1 line 120-1, and the gates of N-channel MOS row select transistors 122-4 through 122-6 are each connected to the ROW SELECT2 line 120-2. The sources of N-channel MOS row select transistors 122-1 and 122-4 are connected to first column output line 118-1, the sources of N-channel MOS row select transistors 122-2 and 122-5 are connected to second column output line 118-2, and the sources of N-channel MOS row select transistors 122-3 and 122-6 are connected to third column output line 118-3.

In the operation of the active pixel sensor 100-5, charge stored on any of the storage nodes 108-1 through 108-6 in is read out in response to the assertion of signals on either of the ROW SELECT1 and ROW SELECT2 lines applied to the gates of N-channels MOS row select transistors 122-1 through 122-3 or 122-4 through 122-6 to which the storage nodes 108-1 through 106-3 or 108-4 through 108-6, respectively, are coupled and by sensing the column output lines 118-1 through 118-3 to which the storage nodes are coupled.

For example, to select a pixel information stored on the storage node 108-1, the signal on ROW SELECT1 line 120-1 will be asserted and the first column output line 118-1 will be sensed. In embodiments where multiple storage nodes are employed, the matrixing of the storage nodes 108-1 through 108-6 using ROW SELECT1 and ROW SELECT2 lines 120-1 and 120-2 and first, second, and third column output lines 118-1, 118-2, and 118-3 reduces the number of additional row and column lines required. It should also be understood that instead of the single global XFR line depicted in FIG. 1 that first and second global transfer lines XFR1 and XFR2 (shown at reference numerals 116-1 and 116-2) will be employed, allowing for motion sensing, multiple exposure times, and the like.

FIGS. 16A and 16B are timing diagrams showing the RESET-N, RESET-P, XFR1 and XFR2 signals and illustrating the operation of active pixel sensor 100-5. In FIG. 16A, with XFR1 signal asserted high on line 116-1, the RESET-N and RESET-P signals (shown for simplicity as a single RESET signal) make a transition at falling edge 130 to begin the accumulation of charge on storage nodes 108-1, 108-2, and 108-3. The XFR1 signal then makes a transition at falling edge 132, halting the accumulation of charge on storage nodes 108-1, 108-2, and 108-3. The RESET signal is then makes a transition at rising edge 134 to reset the voltage of the photodiodes in the three-diode dual photosensor structure 78. The XFR2 signal on line 116-2 then makes a transition at rising edge 136. When the RESET signal makes a transition at falling edge 138, accumulation of charge on storage nodes 108-4, 108-5, and 108-6 begins. The XFR2 signal on line 116-2 then makes a transition at falling edge 140, halting the accumulation of charge on storage nodes 108-4, 108-5, and 108-6.

In FIG. 16B, with XFR1 and XFR2 lines both asserted high, the RESET signal makes a transition at falling edge 150 to begin the accumulation of charge on storage nodes 108-1, 108-2, 108-3, 108-4, 108-5, and 108-6. The XFR1 signal then makes a transition at falling edge 152, halting the accumulation of charge on storage nodes 108-1, 108-2, and 108-3. The accumulation of charge on storage nodes 108-4, 108-5, and 108-6 continues. Then XFR2 signal makes a transition at falling edge 154, halting the accumulation of charge on storage nodes 108-4, 108-5, and 108-6.

Having now fully described the advantages of a full RGB imager, the reader is now directed to FIG. 17 and the storage and retrieval method described therein.

Referring now to FIG. 17, a block diagram of a typical prior-art image capture and display system is shown. An image is first captured by filter-mosaic imager 210 having M pixel sensors. Color image sensors in the prior art typically sense only one of the three primary colors at each pixel location, through a mosaic of color filters integrated onto the image sensor chip, in distinction from the full-color sensors of the present invention that sense each of the three colors at each pixel location. In a typical system, the prior-art filter-mosaic imager may consist of, for example, an array of 640 pixel sensors by 480 pixel sensors delivering a dataset having a total of M=307,200 bytes of pixel data. A more dense imager may consist of an array of 3,000 pixel sensors by 2,000 pixel sensors, for a total of M=6,000,000 bytes of pixel data in the dataset.

The output dataset from pixel sensors in imager 210 is then processed by interpolator 212 in order to convert it to a full RGB dataset as is known in the art. The interpolation process increases the size of the dataset to 3M. Color transformations and corrections are then performed on the dataset by color corrector 214, as is known in the art.

After interpolation and color correction have been performed on the output pixel dataset from the imager 210, data compression, such as JPEG compression, is performed on the dataset in data compressor 216. JPEG compression is an industry standard and results in an adjustable degree of compression for which 0.25x is a typical example, resulting in a decrease in the size of the dataset to 0.75M as shown in FIG. 17.

After the dataset has been compressed, it may then be stored in storage element 218. Storage element 218 has taken numerous forms in the prior art, such as magnetic storage (e.g., floppy disks), or digital semiconductor memory storage such as flash or random access memory.

When it is desired to display or print a stored digital image, the stored compressed data representing the color-corrected image is first retrieved from storage element 218 by storage retrieval element 220. The nature of storage retrieval element 220 depends on the nature of storage element 218 with which it functions, as is appreciated by persons of ordinary skill in the art.

After the stored dataset representing the image has been retrieved from storage element 218 by storage retrieval element 220, it is then decompressed by decompression element 222 as is known in the art and then provided to display or printer 224 as required by the user.

The image data storage and retrieval method performed by the system of FIG. 17 is easily inferred from the block diagram of FIG. 17. The steps of the image data storage and retrieval method performed by the prior art image capture and display system will be referred to using the same reference numerals that identified the elements performing these steps. Thus, first, at step 210, an image is captured by the imager. Next, at step 212, the dataset representing the image is interpolated to produce a full RBG dataset. The RGB dataset is then processed at step 214 to perform color transformation and correction on the dataset as desired. At step 16 the dataset is compressed and at step 218 the dataset is then stored.

When it is desired to display or print a stored digital image, the stored compressed dataset representing the color-corrected RGB image is first retrieved from storage at step 220. The retrieved compressed dataset representing the image is then decompressed at step 222 as is known in the art. Finally, at step 224, the image data is then provided to display or printer 224 as required by the user using conventional techniques.

The interpolation step 212 and the compression step 216 performed by the prior-art scheme depicted in FIG. 17 are "lossy" in that they represent a compromise with respect to the resolution of the original image data in the dataset obtained from the imager 210. These steps are irreversible in that the original dataset taken from the imager 210 is not recoverable. More importantly, the original dataset from imager 210 is incapable of rendering a complete description of the image falling on the sensor array. It is well known in the art that to achieve a complete description of an image, the image must be sampled at least twice in each dimension for each cycle of the highest spatial frequency present in the optical image. The highest spatial frequency is typically set by the modulation transfer function of the lens, which for typical photographic lenses is on the order of one cycle per 10 micrometers. The size of a typical photosensor on a high density imaging array is about 5 micrometers, so the sampling criterion is just satisfied. However, with a filter mosaic, the repeated unit used to sample the image consists of 4 sensors, and is typically between 10 and 20 micrometers in each dimension. This large sampling interval inevitably results in an irreversible loss of information by confusing higher spatial frequencies with lower spatial frequencies; this problem is known as aliasing. The alias artifacts created by this procedure are seen in digital images as moire patterns on fine-pitched fabrics, or as colored highlights along edges and fine lines. The aliasing artifacts are usually preserved and often accentuated by lossy compression techniques and by attempts to sharpen the image.

FIGS. 18A and 18B are block diagrams of alternate embodiments of an image capture and display system without compression according to the present invention. With reference first to FIG. 18A, one embodiment of an image capture and display system 230 according to the present invention is presented.

Image capture and display system 230 preferably includes a full RGB imager 232, i.e., an imager that senses all of the three primary colors at each pixel location to produce a full RGB image dataset. As will be apparent to one skilled in the art, the full RGB imager 232 may optimally be located in an imaging device such as a digital camera.

A full RGB output dataset from pixel sensors in imager 232 is then processed by color corrector 234 to perform color transformations and corrections. Color corrector 234 may be configured as in the prior art example shown in FIG. 17 and its structure and operation are therefore familiar to persons of ordinary skill in the art. Examples of color transformations and corrections that may be performed by color corrector 234 are dark signal subtraction, matrixing, bad pixel replacement, linearization and gamma encoding. Color correction is optional and need not be performed according to the present invention if unnecessary.

After color correction has been performed on the RGB dataset from the imager 232 of the present invention, the color-corrected dataset may then be directly stored in storage element 236. Storage element 236 may take numerous forms, such as magnetic storage (e.g., floppy disks), or digital semiconductor memory storage such as flash or random access memory. Persons of ordinary skill in the art will observe that other storage techniques, such as optical storage, may also be used in the system and method of the present invention is not limited to those storage techniques specifically enumerated herein.

When it is desired to display or print a stored digital image according to the system and method of the present invention, the dataset representing the stored color-corrected image is first retrieved from storage element 236 by storage retrieval element 238. Persons of ordinary skill in the art will appreciate that the nature of storage retrieval element 220 depends on the nature of storage element 218 with which it functions. As a non-limiting example, if semiconductor memory is employed in the present invention, the conventional memory addressing and reading circuitry will perform the function of storage retrieval element 238.

After the dataset representing the stored color-corrected image has been retrieved from storage element 236 by storage retrieval element 238, it may then be interpolated by interpolation element 240. According to the present invention, interpolation element 240 may perform the process of interpolating from sensor resolution to a higher output resolution, for example to prevent pixel artifacts on a print on the data in the dataset prior to display or printing. Interpolation element 240 may comprise, for example, a microprocessor running interpolation software as would be appreciated by persons of ordinary skill in the art. Persons of ordinary skill in the art will recognize that the interpolation step is not necessary to the practice of the present invention.

Finally, the interpolated dataset from interpolation element 240 is then provided to display or printer 242 as required by the user or may be stored or transmitted in this higher resolution form for later use or further processing, as when a photographer delivers an image to a client. Hardware and software techniques for providing image data to printers or displays are well known to persons of ordinary skill in the art.

The image data storage and retrieval method of the present invention performed by the system of FIG. 18A is easily inferred from the block diagram therein. The steps of the image data storage and retrieval method performed by the image capture and display system of FIG. 18A will be referred to using the same reference numerals that identified the elements performing these steps. Thus, first, at step 232, an image is captured by the imager and an image dataset is formed. Next, at step 234, the image dataset is then processed to perform color transformation and/or correction if desired. At step 236 the dataset is then stored.

When it is desired to display or print a stored digital image, the stored dataset representing the color-corrected image is retrieved from storage at step 238. The retrieved dataset representing the stored color-corrected image may then be interpolated at step 240 if desired. Finally, at step 242, the image dataset is then provided to display or printer as required by the user and known to persons of ordinary skill in the art.

As may be observed from an examination of FIG. 18A, the amount of data M in the dataset remains constant throughout the storage and retrieval process until the interpolation step 240, where the size of the dataset is increased by the interpolation process. In the example given in FIG. 18A, the optional interpolation step increases the amount of data in the image dataset from M to 4M. Persons of ordinary skill in the art will recognize that the example shown in FIG. 18A is a non-limiting example, and other interpolation processes performed in accordance with the principles of the present invention will result in increasing the amount of data by factors other than 4.

Referring now to FIG. 18B, a variation on the image capture and display system and method of the present invention of FIG. 18A is presented. Because the elements and process steps of the embodiment of FIG. 18B are present in the embodiment of FIG. 18A, the same reference numerals used in FIG. 18A will be employed to identify the corresponding elements and steps of the embodiment of FIG. 18B.

In the variation of the image capture and display system and method of the present invention depicted in FIG. 18B, the full RGB dataset from imager 232 is stored in storage element 36 without any color transformation or correction being performed. As may be seen from an examination of FIG. 18B, the color transformation and/or correction is performed on the dataset after retrieval from storage at step 238 and prior to interpolation and display or printing. Otherwise, the image capture and display system depicted in FIG. 18B may be identical to that depicted in FIG. 18A.

The image capture and display method performed by the embodiment of the present invention depicted in FIG. 18B starts with the same step 232 of the method of FIG. 18A wherein the image data is captured by the imager and formed into an image dataset. Next, at step 236, the raw image dataset is stored.

When it is desired to display or print a stored digital image, the dataset representing the stored image is retrieved from storage at step 238. Color correction and/or transformation is then performed on the retrieved data at step 234. The dataset representing the color-corrected image may then be interpolated at step 240 if desired. Finally, at step 242, the dataset is then provided to display or printer as required by the user and known to persons of ordinary skill in the art.

As may be observed from an examination of FIG. 18B, the amount of data M in the image dataset remains constant throughout the storage and retrieval process until the interpolation step 240, where the amount of data in the dataset is increased by the interpolation process. In the example given in FIG. 2B, the optional interpolation step increases the amount of data in the image dataset by a factor of 4 from M to 4M. Persons of ordinary skill in the art will recognize that the example shown in FIG. 2B is a non-limiting example, and other interpolation processes performed in accordance with the principles of the present invention will result in increasing the amount of data in the image dataset by factors other than 4.

FIGS. 19A and 19B are block diagrams of alternate embodiments of an image capture and display system and method using compression according to the present invention. According to the embodiments of FIGS. 19A and 19B, the image dataset may be compressed to decrease the system storage requirements. Because certain of the elements and process steps of the embodiment of FIGS. 19A and 3B are present in the embodiments of FIGS. 19A and 19B, the same reference numerals used in FIGS. 19A and 19B will be employed to identify the corresponding elements and steps of the embodiments of FIGS. 19A and 19B.

Referring now to FIG. 19A, one embodiment of the second image capture and display system 260 using compression according to the present invention is presented.

Image capture and display system 260 includes a full RGB imager 232 as described with reference to the previously-described embodiment. A full RGB output dataset from the pixel sensors in imager 232 is then processed by color corrector 234 to perform color transformations and corrections on the image dataset. Color corrector 234 may be configured as in the prior art example shown in FIG. 17 and the embodiments of the present invention illustrated in FIGS. 18A and 18B. Color correction according to this embodiment of the present invention is optional and need not be performed if deemed unnecessary.

After optional color correction has been performed on the image dataset from the imager 232 of the present invention, the color corrected image dataset may then be subjected to a data-compression step in data compressor 262. The data compression step performed according to the present invention in data compressor 232 is a lossless compression, i.e., one such that the stored data can be later decompressed to produce the identical pre-compression data, or a "nearly lossless compression step. As will be appreciated by persons of ordinary skill in the art, various means, such as a compression integrated circuit or a microprocessor running compression software may be used to perform this function.

Compared to prior art methods, the present invention as disclosed herein provides a better combination of image quality and data storage requirements in a system in which quality is a dominant concern. Prior art methods that sense colors through a filter mosaic, then interpolate, and then compress, can achieve a comparable combination of image resolution and storage requirements, but then suffer from a potential for aliasing at the sensor; aliasing is a well-known artifact of sensing through a filter mosaic, and can not be fully corrected by subsequent processing.

Furthermore, by not interpolating before storage, the present invention allows the image processing steps such as color correction (matrixing, bad pixel replacement, and such steps) to be done after retrieval of the image data, and therefore allow for improved or modified processing steps to be used at retrieval time. Therefore, the image quality is not irretrievably compromised by the processing and correction algorithms at the time of image capture and storage. Furthermore, since the full RGB image sensor delivers all three color measurements at each pixel location, the data can be stored in a standard RGB scanned image format file without data interpolation or other expansion operations; this property of the invention allows the data to be stored and retrieved in a standard way such that subsequent processing can be done with standard color image processing tools.

In embodiments of the present invention employing compression, the same advantages can be retained while further reducing the size of the stored dataset, for example by about half. As an example of using standard color image file formats, the TIFF (tagged image file format) standard allows an LZW (Lempel-Ziv-Welch) lossless compression that is compatible with standard TIFF file retrieval tools. Since the decompressed dataset matches exactly the dataset before compression, no loss of quality is necessary to gain this storage advantage.

Storage of data, such as image datasets, generally involves some kind of data precision compromise, such as the number of bits per color per pixel; that compromise is usually viewed a representation issue, rather than a compression issue. For example, image sensors generally measure light intensity and represent the result using 10 to 14 bits in a linear representation of intensity; before delivering that data as an image, however, they most often convert to a nonlinear or gamma-compressed representation and then round to 8 bits per color per pixel. At this level of precision and this nonlinear representation, the resulting loss of quality is usually far below a perceptible level. In the present invention, the advantage of storing raw data, or color corrected processed data, from an RGB imager, can be retained if the dataset is converted to a conventional 8-bit-per-color-per-pixel representation and stored without compression or with lossless compression.

Furthermore, the same advantages can be obtained by storing the image dataset using a "nearly lossless" compression technique, especially in cases in which the dataset is not first converted to a representation with a small number of bits per pixel per color. For example, if the imager, or the color corrector, delivers an image using 14 bits per pixel per color, then a nearly lossless compression algorithm can be used on that dataset directly, as long as the retrieved and decompressed dataset is sufficiently close to the original dataset to keep the errors below a perceptible level.

For the purpose of the present invention, an image compression/decompression technique is defined to be "nearly lossless" if the error between the original image and the decompressed image is not more than three times the error of the usual representational step of converting to 8-bit gamma-compressed data; the errors are measured in a root-mean-square sense on typical images, in which the usual statistics of quantization give an rms error of ⅓ of an 8-bit LSB step for the usual quantization, so allow an error equivalent to 1 LSB step for nearly lossless compression/decompression with 8-bit gamma-encoded output.

Note that most lossy image compression techniques, including JPEG with a quality setting of "maximum", lead to larger errors, and so are not in the class of "nearly lossless" as defined herein. The defining threshold has been taken to be approximately the amount of noise added by a few typical image processing steps such as minor curves or level adjustment in a program such as Adobe Photoshop, since these are not usually regarded as significantly lossy operations.

The particular type of either lossless or nearly lossless data compression used with actual embodiments fabricated according to the principles of the present invention is largely a matter of design choice.

After data compression, the compressed image dataset is stored in storage element 236. Storage element 236 may take the same numerous forms, such as magnetic storage (e.g., floppy disks), or digital semiconductor memory storage such as flash or random access memory, as in the previously-described embodiments of the invention.

When it is desired to display or print a stored digital image according to the system and method of the present invention, the stored data representing the color-corrected image is first retrieved from storage element 236 by storage retrieval element 238. As with the previously described embodiments of the present invention, persons of ordinary skill in the art will appreciate that the nature of storage retrieval element 220 depends on the nature of storage element 218 with which it functions.

Referring back to FIG. 19A, after stored data has been retrieved from storage element 236 by storage retrieval element 238, it is expanded or decompressed in data-expander element 264. The nature of data-expander element 264 will depend on the nature of data compression element 262, since these two elements perform functions which are the inverse of one another, or nearly so. Data expander technology is well known in the art.

After the retrieved image dataset has been expanded, it may then be interpolated by interpolation element 240. Interpolation element 240 may be the same as in the previously described embodiments herein. As with the previously described embodiment herein, persons of ordinary skill in the art will recognize that the interpolation step is not necessary to the practice of the present invention.

Finally, the interpolated image dataset from interpolation element 240 is then provided to display or printer 242 as required by the user employing known hardware and software techniques for providing image data to printers or displays.

The image data storage and retrieval method of the present invention performed by the system of FIG. 19A is easily inferred from the block diagram therein. The steps of the image data storage and retrieval method performed by the image capture and display system of FIG. 19A will be referred to using the same reference numerals that identified the elements performing these steps. Thus, first, at step 232, an image is captured by the imager and an image dataset is formed. Next, at step 234, the image dataset is then processed to perform color transformation and/or correction if desired to produce a color-corrected image dataset. Next, at step 262, lossless or "nearly lossless" data compression is performed on the color-corrected image datset prior to storage. At step 236 the compressed image dataset is then stored.

When it is desired to display or print a stored digital image, the stored data representing the color-corrected image is retrieved from storage at step 238. Next, the retrieved data is expanded at step 264. The retrieved data representing the color-correcteded image may then be interpolated at step 240 if desired. Finally, at step 242, the image dataset is then provided to display or printer as required by the user and known to persons of ordinary skill in the art.

As may be observed from an examination of FIG. 19A, the amount of data stored is less than that stored in the embodiments of FIGS. 18A and 18B. In the embodiments described in FIGS. 18A and 18B, the amount of data M in the image dataset remains constant throughout the storage and retrieval process until the interpolation step 240, where the amount of data may be increased by the interpolation process. In the example given in FIG. 3A, the data compression step decreases the amount of data in the image dataset to M/2, but persons of ordinary skill in the art will recognize that other data compression steps producing other compression ratios may be performed in accordance with the present invention.

As in the embodiment of FIGS. 18A and 18B, the optional interpolation step in the embodiment of FIG. 19A performed after data expansion increases the amount of data in the image dataset from M to 4M. Persons of ordinary skill in the art will recognize that the example shown in FIG. 18A is a non-limiting example, and other interpolation processes performed in accordance with the principles of the present invention will result in increasing the amount of data in the dataset by factors other than 4.

Referring now to FIG. 19B, a variation on the image capture and display system and method of the present invention of FIG. 19A is presented. Because the elements and process steps of the embodiment of FIG. 19B are present in the embodiment of FIG. 19A, the same reference numerals used in FIG. 19A will be employed to identify the corresponding elements and steps of the embodiment of FIG. 19B.

In the variation of the image capture and display system and method of the present invention depicted in FIG. 19B, the compressed RGB dataset from imager 232 is stored in storage element 236 without any color transformation or correction being performed. As may be seen from an examination of FIG. 18B, the color transformation and/or correction is performed after retrieval of the image dataset from storage at step 238 and data expansion at step 264 and prior to interpolation and display or printing. Otherwise, the image capture and display system depicted in FIG. 19B may be identical to that depicted in FIG. 19A.

The image capture and display method performed by the embodiment of the present invention depicted in FIG. 19B starts with the same step 232 of the method of FIG. 19A wherein the image data is captured by the imager and an image dataset is formed. Next, at step 262, data compression is performed on the image dataset from imager 232. The compressed image data is then stored at step 236.

When it is desired to display or print a stored digital image, the stored dataset representing the image is retrieved from storage at step 238. The dataset is then decompressed at step 264. Color correction and/or transformation is then performed on the retrieved image dataset at step 234. The color corrected image dataset may then be interpolated at step 240 if desired. Finally, at step 242, the image data is then provided to display or printer as required by the user and known to persons of ordinary skill in the art.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A method for storing a full RGB dataset comprising:
providing an image sensor having a plurality of pixel locations and configured to sense, at the same place in each pixel location, all three primary colors in order to produce a full RGB dataset as three-color output data;

providing a digital storage device coupled to said image sensor;

sensing three-color digital output data representing said full RGB dataset from said image sensor; and storing said three-color output data as digital data in said digital storage device without performing any interpolation on said three-color output data.

2. The method of claim 1 wherein providing said digital storage device further comprises providing a semiconductor memory device.

3. The method of claim 1 wherein providing said digital storage device further comprises providing a magnetic storage device.

4. The method of claim 1 wherein providing said digital storage device further comprises providing an optical storage device.

5. The method of claim 1 further including performing a lossless compression operation on said three-color output data prior to storing said three-color digital output data as digital data in said digital storage device.

6. The method of claim 1 further including performing a nearly lossless compression operation on said three-color output data prior to storing said three-color digital output data as digital data in said digital storage device.

7. A method for processing digital information from an image sensor comprising:

providing an image sensor having a plurality of pixel locations and configured to sense, at the same place in each pixel location, all three primary colors in order to produce a full RGB dataset as three-color output data;

providing a digital storage device coupled to said image sensor;

sensing three-color output data representing said full RGB dataset from said image sensor;

storing said three-color output data as digital data in said digital storage device without performing any interpolation on said three-color digital output data; and retrieving said three-color output data as digital data from said digital storage device.

8. The method of claim 7 wherein providing said digital storage device further comprises providing a semiconductor memory device.

9. The method of claim 7 further including:

performing a lossless compression operation on said three-color output data prior to storing said three-color output data as digital data in said digital storage device; and performing a lossless decompression operation on said three-color output data after retrieving said three-color digital output data as digital data from said digital storage device.

10. The method of claim 7 further including:

performing a nearly lossless compression operation on said three-color output data prior to storing said three-color output data as digital data in said digital storage device; and performing a nearly lossless decompression operation on said three-color output data after retrieving said three-color digital output data as digital data from said digital storage device.

11. A method for storing digital information from a single-chip image sensor comprising:

providing a single-chip image sensor producing three-color output data from the same place in each of a plurality of pixel locations;

providing a digital storage device coupled to said single-chip image sensor;

sensing three-color digital output data from said single-chip image sensor; and storing said three-color output data as digital data in said digital storage device without performing any interpolation on said three-color output data.

12. The method of claim 11 wherein providing said digital storage device further comprises providing a semiconductor memory device.

13. The method of claim 11 wherein providing said digital storage device comprises providing a magnetic storage device.

14. The method of claim 11 wherein providing said digital storage device further comprises providing an optical storage device.

15. The method of claim 9 further including performing a lossless compression operation on said three-color output data prior to storing said three-color digital output data as digital data in said digital storage device.

16. The method of claim 9 further including performing a nearly lossless compression operation on said three-color output data prior to storing said three-color digital output data as digital data in said digital storage device.

17. A method for processing digital information from a single-chip image sensor comprising:

providing a single-chip image sensor producing three-color output data from the same place in each of a plurality of pixel locations;

providing a digital storage device coupled to said single-chip image sensor;

sensing three-color output data from said single-chip image sensor;

storing said three-color output data as digital data in said digital storage device without performing any interpolation on said three-color digital output data; and retrieving said three-color output data as digital data from said digital storage device.

18. The method of claim 17 wherein providing said digital storage device further comprises providing a semiconductor memory device.

19. The method of claim 17 further including:

performing a lossless compression operation on said three-color output data prior to storing said three-color output data as digital data in said digital storage device; and performing a lossless decompression operation on said three-color output data after retrieving said three-color digital output data as digital data from said digital storage device.

20. The method of claim 17 further including:

performing a nearly lossless compression operation on said three-color output data prior to storing said three-color output data as digital data in said digital storage device; and performing a nearly lossless decompression operation on said three-color output data after retrieving said three-color digital output data as digital data from said digital storage device.

21. A method for processing digital information from a triple-junction active pixel array comprising:

providing a triple-junction active pixel array producing a full RGB image data set;

providing a digital storage device coupled to said triple-junction active pixel array;

sensing the full RGB data set from the same place in said triple-junction active pixel array;

storing said full RGB data set as digital data in said digital storage device without performing any interpolation on said full RGB data set; and retrieving said full RGB data set as digital data from said digital storage device.

22. The method of claim 21 wherein providing said digital storage device further comprises providing a semiconductor memory device.

23. The method of claim 21 further including:

performing a lossless compression operation on said full RGB data set prior to storing said full RGB data set as digital data in said digital storage device; and performing a lossless decompression operation on said full RGB data set after retrieving said full RGB data set as digital data from said digital storage device.

24. The method of claim 21 further including:

performing a nearly lossless compression operation on said full RGB data set prior to storing said full RGB data set as digital data in said digital storage device; and performing a nearly lossless decompression operation on said full RGB data set after retrieving said full RGB data set as digital data from said digital storage device.

25. A method for processing digital information from a digital camera image capture and display system comprising:

providing a digital camera having a triple-junction active pixel array;

providing a digital storage device coupled to said triple-junction active pixel array;

producing a full RGB data set from the same place in said triple-junction active pixel array;

sensing the full RGB data set from said triple-junction active pixel array into said digital storage device;

storing said full RGB data set as digital data in said digital storage device without performing any interpolation on said full RGB data set; and retrieving said full RGB data set as digital data from said digital storage device.

26. The method of claim 25 wherein providing said digital storage device further comprises providing a semiconductor memory device.

27. The method of claim 25 further including:

performing a lossless compression operation on said full RGB data set prior to storing said full RGB data set as digital data in said digital storage device; and performing a lossless decompression operation on said full RGB data set after retrieving said full RGB data set as digital data from said digital storage device.

28. The method of claim 25 further including:

performing a nearly lossless compression operation on said full RGB data set prior to storing said full RGB data set as digital data in said digital storage device; and performing a nearly lossless decompression operation on said full RGB data set after retrieving said full RGB data set as digital data from said digital storage device.

* * * * *